United States Patent
Suehiro et al.

(10) Patent No.: US 6,906,459 B2
(45) Date of Patent: Jun. 14, 2005

(54) LIGHT EMITTING DIODE

(75) Inventors: Yoshinobu Suehiro, Aichi (JP); Yuji Takahashi, Aichi (JP); Koichi Kaga, Aichi (JP); Kouji Uchida, Saitama (JP); Yuji Sekitomi, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 176 days.

(21) Appl. No.: 09/749,636

(22) Filed: Dec. 28, 2000

(65) Prior Publication Data

US 2001/0024087 A1 Sep. 27, 2001

(30) Foreign Application Priority Data

| Dec. 28, 1999 | (JP) | 11-372440 |
| Feb. 3, 2000 | (JP) | 2000-026226 |
| Oct. 13, 2000 | (JP) | 2000-312893 |
| Nov. 14, 2000 | (JP) | 2000-346647 |

(51) Int. Cl.[7] .............................................. H01J 63/04
(52) U.S. Cl. ..................... 313/512; 313/113; 257/99; 257/100
(58) Field of Search ........................... 372/45, 46, 43; 362/296, 310, 341, 347, 800; 313/512, 113, 483, 502; 257/98

(56) References Cited

U.S. PATENT DOCUMENTS

| 3,875,456 | A | * | 4/1975 | Kano et al. .................. 313/501 |
| 3,938,177 | A | * | 2/1976 | Hansen et al. ................ 257/98 |
| 4,853,593 | A | * | 8/1989 | Stein ........................... 313/500 |
| 5,281,889 | A | * | 1/1994 | Fields et al. ................. 313/113 |
| 5,384,471 | A | | 1/1995 | Schairer et al. |
| 5,472,915 | A | | 12/1995 | Schairer et al. |
| 5,623,181 | A | * | 4/1997 | Suehiro et al. ............. 313/512 |
| 5,813,752 | A | * | 9/1998 | Singer et al. ................ 362/293 |
| 5,924,785 | A | | 7/1999 | Zhang et al. |
| 5,959,316 | A | | 9/1999 | Lowery |
| 6,331,063 | B1 | * | 12/2001 | Kamada et al. ............. 362/237 |
| 6,396,082 | B1 | * | 5/2002 | Fukasawa et al. ........... 257/79 |
| 6,483,623 | B1 | | 11/2002 | Maruyama |

FOREIGN PATENT DOCUMENTS

| EP | 0 590 336 A1 | 9/1993 |
| JP | 3-70187 | 3/1991 |
| JP | 03-070187 | 3/1991 |
| JP | 0450 560 A2 | 4/1991 |
| JP | 04-162576 | 6/1992 |
| JP | 08-037321 | 2/1996 |
| JP | 08-056019 | 2/1996 |
| JP | 08-306961 | 11/1996 |
| JP | 10-144966 | 5/1998 |
| JP | 10-150222 | 6/1998 |
| JP | 10-150266 | 6/1998 |
| JP | 10-242513 | 9/1998 |
| JP | 11-017227 | 1/1999 |
| JP | 11-017229 | 1/1999 |
| JP | 11-150295 | 6/1999 |
| JP | 11-163411 | 6/1999 |
| JP | 11-177145 | 7/1999 |
| JP | 11-186610 | 7/1999 |
| JP | 11-266035 | 9/1999 |
| JP | 11-317546 | 11/1999 |

* cited by examiner

*Primary Examiner*—Edward J. Glick
*Assistant Examiner*—Elizabeth Keaney
(74) *Attorney, Agent, or Firm*—McGinn & Gibb, PLLC

(57) ABSTRACT

A light-emitting diode includes a light-emitting element, a lead assembly for supplying electrical power to the light-emitting element. A reflection mirror is provided in an opposing relation to the light-emitting surface of the light-emitting element. A light-transmissible material seals the light-emitting element, a part of the lead assembly, and the reflection mirror. A radiation surface radiates light reflected on the reflection mirror to the outside. The reflection mirror is a metal mirror which is obtained by processing a metal plate to give it a concave shape or which is obtained by mirror-surface-treating the concave surface of the metal mirror formed by the processing of the metal plate. The radiation surface is formed on the light-transmissible material at its surface at the rear of the light-emitting element.

24 Claims, 27 Drawing Sheets

LIGHT EMITTING DIODE

BACKGROUND OF THE INVENTION

1. Field of the Invention

The present invention relates to a light-emitting diode (LED) in which light emitted by a light-emitting element is reflected by a concave reflection surface, and then reflected light is radiated to the outside. The term "light-emitting element" used herein refers to an LED chip itself, and the term "light-emitting diode" refers to a resin package carrying such an LED chip or a light-emitting device at large including an optical system such as a lens system.

2. Description of the Related Art

There have been devised light-emitting diodes having a variety of structures. Of such various light-emitting diodes, a reflection type light-emitting diode has a feature of being able to effectively radiate light emitted from a light-emitting element to the outside, and to be made thin. Description will be given below of the conventional reflection type light-emitting diode.

FIG. 27 is a schematic cross-sectional view of a first reflection type light-emitting diode according to the related art. The light emitting diode 80 shown in FIG. 27 comprises a light-emitting element 81, lead assemblies 82a and 82b, a bonding wire 83, a light-transmissible material 84, a reflection substrate 85 and a radiation plate 86.

The light-emitting element 81 is mounted on one end of the lead assembly 82a, and the light-emitting element 81 and the lead assembly 82b are electrically interconnected by the bonding wire 83. The refection substrate 85 is produced through molding of a resin and has a concave mirror surface 85a for light reflection on its center. The reflection mirror surface 85a has been formed on the concave surface of the reflection substrate 85 by subjecting the surface to an appropriate treatment, such as metal vapor deposition. Lead assemblies 82a and 82b are placed above the reflection substrate 85 so as to dispose the light-emitting element 81 opposite to the radiation plate 86. The radiation plate 86 is placed on the whole assembly. The radiation plate 86 is to transmit light reflected by the reflection mirror surface 85a and then to radiate it to the outside. Provision of the radiation plate 86 allows the high precision of the surface through which light is emitted outward. The space between the reflection mirror surface 85a and the radiation plate 86 is filled with a resin 84, and thus the light-emitting diode 81 is embedded in the resin.

FIG. 28 is a schematic cross-sectional view of a second reflection type light-emitting diode according to the related art. The light-emitting diode 90 shown in FIG. 28 comprises a light-emitting element 91, lead assemblies 92a and 92b, a bonding wire 93, a light-transmissible material 94, a concave reflection surface 95, a radiation surface 96, and resin-coated portions 97.

The light-emitting element 91 is mounted on one end of the lead assembly 92a, and the light-emitting element 91 and the lead assembly 92b are electrically interconnected by the bonding wire 93. The light-emitting element 91 and the tip end portions of the lead assemblies 92a, 92b and the bonding wire 93 are integrally sealed by the light-transmissible material 94. The concave reflection surface 95 is produced by mirror-surface-treating one surface of the light-transmissible material 94 according to a suitable method such as plating or metal vapor deposition, and is formed on the side opposite to the light-emitting surface of the light-emitting element 91. A planar radiation surface 96 is formed on the light-transmissible material 94 at its surface opposite to the concave reflection surface 95.

The resin-coated portion 97 is a portion at which a part of lead 92a or 92b is coated with a light-transmissible resin, and is formed around the circumference of the concave reflection surface 95. The resin-coated portion 97 protrudes towards the side at which the concave reflection mirror resides. The reason why the resin-coated portion 97 is implemented is as follows. Assume, as an illustration, that the concave reflection mirror 95 be formed by metal vapor deposition. One surface of the light-transmissible material 94 upon which the mirror is to be formed is totally masked through deposition of an inert vapor excepting the site at which the mirror is to be formed, and then the exposed site receives metal vapor deposition to therewith form a mirror. In this manner, the concave reflection mirror surface 95 is produced. However, if the resin-coated portion 97 were not implemented, metal vapor might creep beneath the mask during metal vapor deposition, adhere to parts of lead assemblies 92a and 92b, and shunt the leads. To avoid the problem involved in the shunting of lead assemblies 92a and 92b, the resin-coated portion 97 is implemented.

The width w of the resin-coated portion 97 has a certain limitation. The lead assemblies 92a and 92b are obtained by removing unnecessary parts from a lead frame. They are prepared by so-called trimming whereby unnecessary parts are cut away from a lead frame, or some other parts are folded at predetermined positions to receive lead assemblies 92a and 92b. If the resin-coated portion 97 had a too small width, parts of the resin-coated portion 97 would be torn off during trimming. To avoid this, it is necessary for the resin-coated portion 97 to have a width so large as to allow it to withstand trimming. To be specific, the width of the resin-coated portion 97 should be at least 1.0 mm.

As a method of manufacturing the reflection type light-emitting diode, there is used transfer molding in which a lead frame is held by upper and lower molding dies, and a thermosetting resin is injected between the molding dies and hardened. The reason why the transfer molding is used is that the reflection type light-emitting diode needs the reflection surface and the radiation surface precisely formed on both sides of the lead frame. The conventional production method based on transfer molding can easily yield light-emitting diodes in a mass production manner.

However, during production of the first light-emitting diode 80 according to the prior art, it is extremely difficult to uniformly fill the concave cavity above the reflection substrate 85 with a resin 84. This is partly because there is no proper apparatus known in the prior art that achieves the required filling of a resin. An alternative conventional method consists of putting an appropriate amount of resin into the concave cavity above the reflection substrate 85, and then placing the lead assemblies 82a and 82b and the radiation plate 86 above the reflection substrate 85, thereby producing a light-emitting diode 80. With this method, however, bubbles may easily creep into the gap between the reflection mirror surface 85a and the radiation plate 86, or the resin 84 may spill over the reflection substrate 85 onto its sides. Bubbles, if any, will affect the radiation characteristics of the light-emitting diode 80, and resin spills, if any, will require an additional complicated technique for their removal. As discussed above, the first light-emitting diode according to the prior art is problematic because its production is difficult and its amenability to mass production is limited.

On the contrary, the second light-emitting diode according to the prior art, although it advantageously allows mass production, is problematic because it can not be produced by a process based on the use of a reflow furnace. Specifically, if wiring of such light-emitting diodes is performed using paste-solder contained in a reflow furnace, the metal coat to serve as the reflection surface 95 might be torn off from the sealing resin 94 because the expansion coefficients of the metal coat and the sealing resin are quite different. If such tears occurred, creases would develop on the reflection surface 95, and would damage the function of reflection surface which depends on the proper reflection of light emitted by light-emitting element 91.

The second light-emitting diode 90 according to the prior art has another problem. With the diode in question, the space between the edge of the reflection surface 95 and the lead assembly 92a or 92b is so narrow that it easily develops cracks when the lead frame is trimmed. The narrowness of the space in question is ascribed to the broadness of the angle with which the light-emitting element views the opposite ends of the reflection surface 95. If that space remains too narrow, it will easily develop cracks during trimming regardless of the transverse width of the resin-coated portion 97.

The second light-emitting diode according to the prior art poses a still other problem: the transverse width w of the resin-coated portion 97 has a lower limit. Because of this, if such light-emitting diodes 90 are arrayed into a grid pattern, the distance between the adjacent diode must be two times the sum of the radius of the circle represented by the circumference of reflection surface 95, the transverse width of resin-coated portion 97, and the distance from the outer edge of resin-coated portion 97 to the angle at which lead assembly 92a or 92b is bent. This makes the light-emitting diode 90 inadequate to be densely packed into a grid pattern.

The second light-emitting diode according to the prior art poses a still other problem. The resin-coated portion 97 is so configured as to easily capture bubbles during molding. Even if molding conditions were adjusted to prevent this, the configuration of resin-coated portion 97 would inevitably lead to the development of more or less voids because the quality of products in a lot is subject to more or less variations. Thus, the implementation of the resin-coated portion 97 may act as a factor responsible for lowering the yield of products.

SUMMARY OF THE INVENTION

In view of the aforesaid aspects, the object of this invention is to provide a light-emitting diode which allows not only mass production but dense packing based on the use of a reflow furnace.

In order to attain the above object, according to the present invention there is provided a light-emitting diode which is comprised of a light-emitting element, a lead assembly for supplying electric power to said light-emitting element, a reflection mirror provided in an opposing relation to the light-emitting surface of said light-emitting element, a light-transmissible material for sealing said light-emitting element, a part of the lead assembly and the reflection mirror, and a radiation surface for radiating light reflected on said reflection mirror to the outside, wherein said reflection mirror is a metal mirror which is obtained by processing a metal plate to give it a concave shape, or which is obtained by mirror-surface-treating the concave surface of said metal mirror, and said radiation surface is formed on the light-transmissible material at its surface at the rear of the light-emitting element.

In order to attain the above object, according to the present invention there is provided a light-emitting diode which is comprised of a light-emitting element, a lead assembly for supplying electric power to said light-emitting element, a reflection mirror provided in an opposing relation to the light-emitting surface of said light-emitting element, and a radiation surface for radiating light reflected on said reflection mirror to the outside, wherein said reflection mirror is a metal mirror which is obtained by combining a plurality of metal portions to give the assembly a concave shape, or which is obtained by mirror-surface-treating the concave surface of said metal mirror.

In order to attain the above object, according to the present invention there is provided a light-emitting diode which is comprised of a light-emitting element, a lead assembly for supplying electric power to said light-emitting element, a reflection mirror provided in an opposing relation to the light-emitting surface of said light-emitting element, a radiation plate for radiating light reflected on said reflection mirror to the outside, and a case for containing said light-emitting element, a part of said lead assembly, and said reflection mirror, wherein said reflection mirror is a metal mirror which is obtained by processing a metal plate to give it a concave shape, or which is obtained by mirror-surface-treating the concave surface of said metal mirror, and said radiation plate is attached to the case, the space enclosed by the radiation plate and the case being closed in an air-tight manner.

In order to attain the above object, according to the present invention there is provided a light-emitting diode which is comprised of a light-emitting element, a lead assembly for supplying electric power to said light-emitting element, a reflection mirror provided in an opposing relation to the light-emitting surface of said light-emitting element, a light-transmissible material for sealing said light-emitting element, a part of the lead assembly and the reflection mirror, and a radiation surface for radiating light reflected on said reflection mirror to the outside, wherein said reflection mirror is a mirror which is obtained by processing ceramic or a resin to give it a concave shape, and said radiation surface is formed on the light-transmissible material at its surface at the rear of the light-emitting element.

In order to attain the above object, according to the present invention there is provided a light-emitting diode which is comprised of a light-emitting element, and a concave reflection mirror provided in an opposing relation to the light-emitting surface of said light-emitting element, light emitted by said light-emitting element being reflected on said reflection mirror, to be radiated to the outside, wherein said reflection mirror is a metal mirror which is obtained by processing a metal plate to give it a concave shape, and said reflection mirror has a linear reflectance of 65% or higher.

In order to attain the above object, according to the present invention there is provided a light-emitting diode which is comprised of a light-emitting element, a lead assembly having a mount for mounting said light-emitting element, and a metal reflection mirror provided in an opposing relation to the light-emitting surface of said light-emitting element, light emitted by said light-emitting element being reflected on said reflection mirror, to be radiated to the outside, wherein said mount has a recess whose mouth opens towards said reflection mirror with the center of the mouth being in alignment with the central axis of the reflection mirror, and the recess contains said light-emitting element, and a fluorescent material which converts the light emitted by said light-emitting element to light of a different wavelength.

In order to attain the above object, according to the present invention there is provided a light-emitting diode which is comprised of a light-emitting element, a lead assembly for supplying electric power to said light-emitting element, a reflection mirror provided in an opposing relation to the light-emitting surface of said light-emitting element, a light-transmissible material for sealing said light-emitting element, a part of the lead assembly and the reflection mirror, and a radiation surface for radiating light reflected on said reflection mirror to the outside, wherein said reflection mirror is a metal mirror which is obtained by pressing a metal plate to give it a concave shape, or which is obtained by mirror-surface-treating the concave surface of said metal mirror; and said radiation surface is formed on the light-transmissible material at its surface at the rear of the light-emitting element.

DESCRIPTION OF THE PREFERRED EMBODIMENTS

Figure 1:
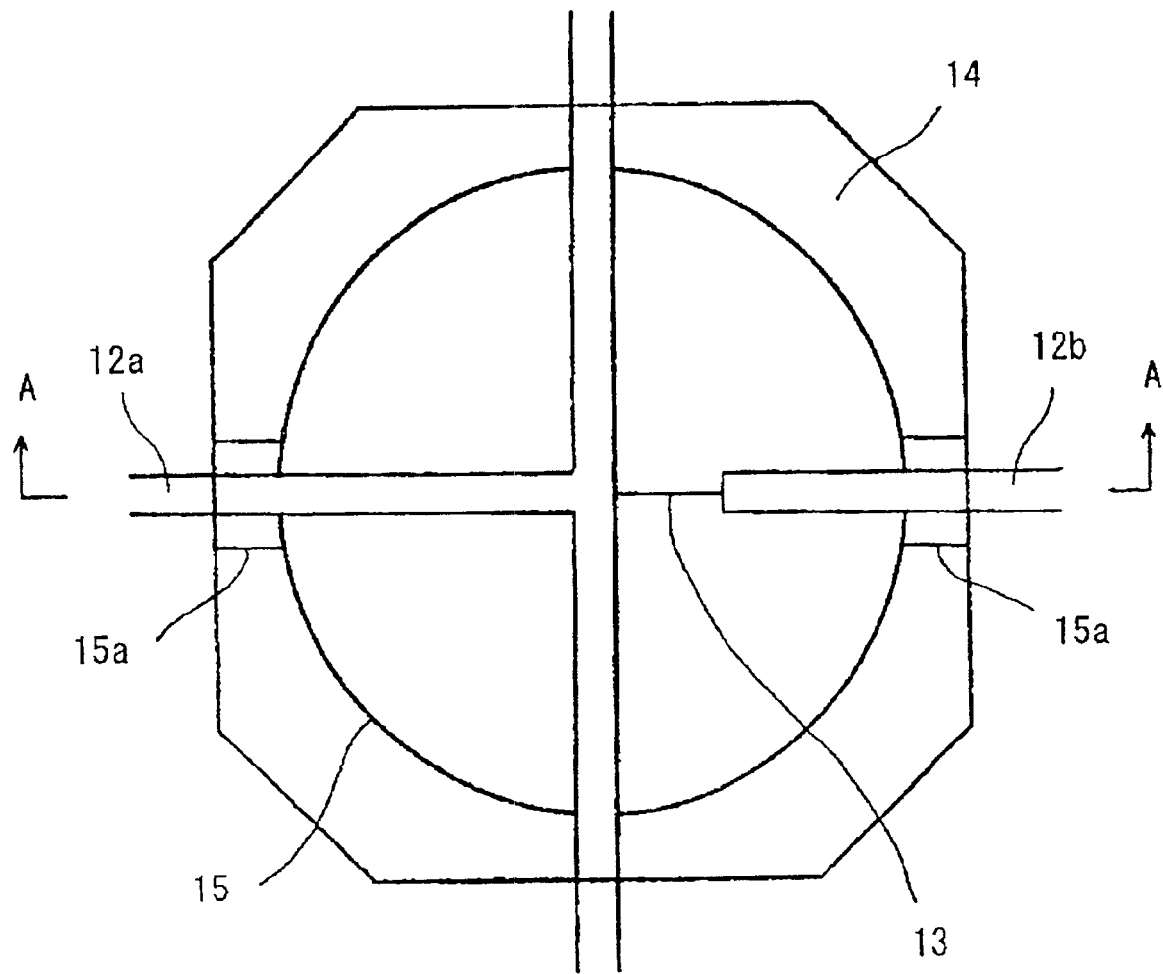
FIG. 1 is a schematic front view illustrating a light-emitting diode according to a first embodiment of the present invention.
Figure 2:
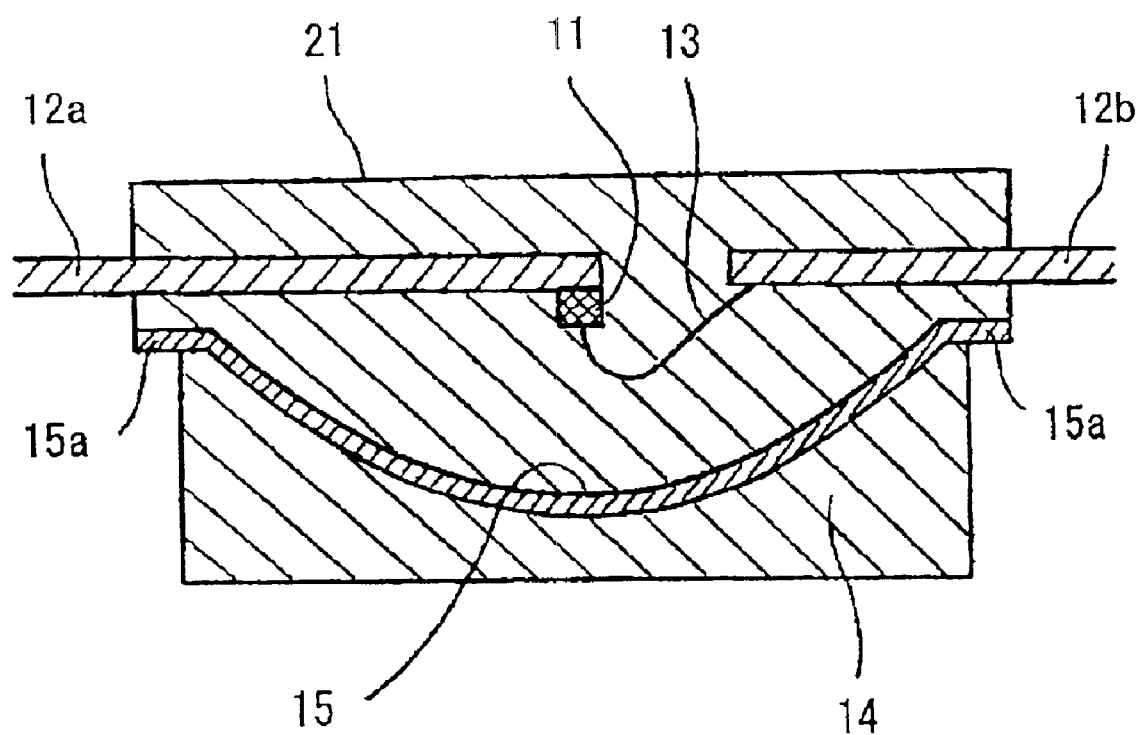
FIG. 2 is a schematic cross-sectional view of the light-emitting diode taken along the line A—A in FIG. 1.
Figure 3:
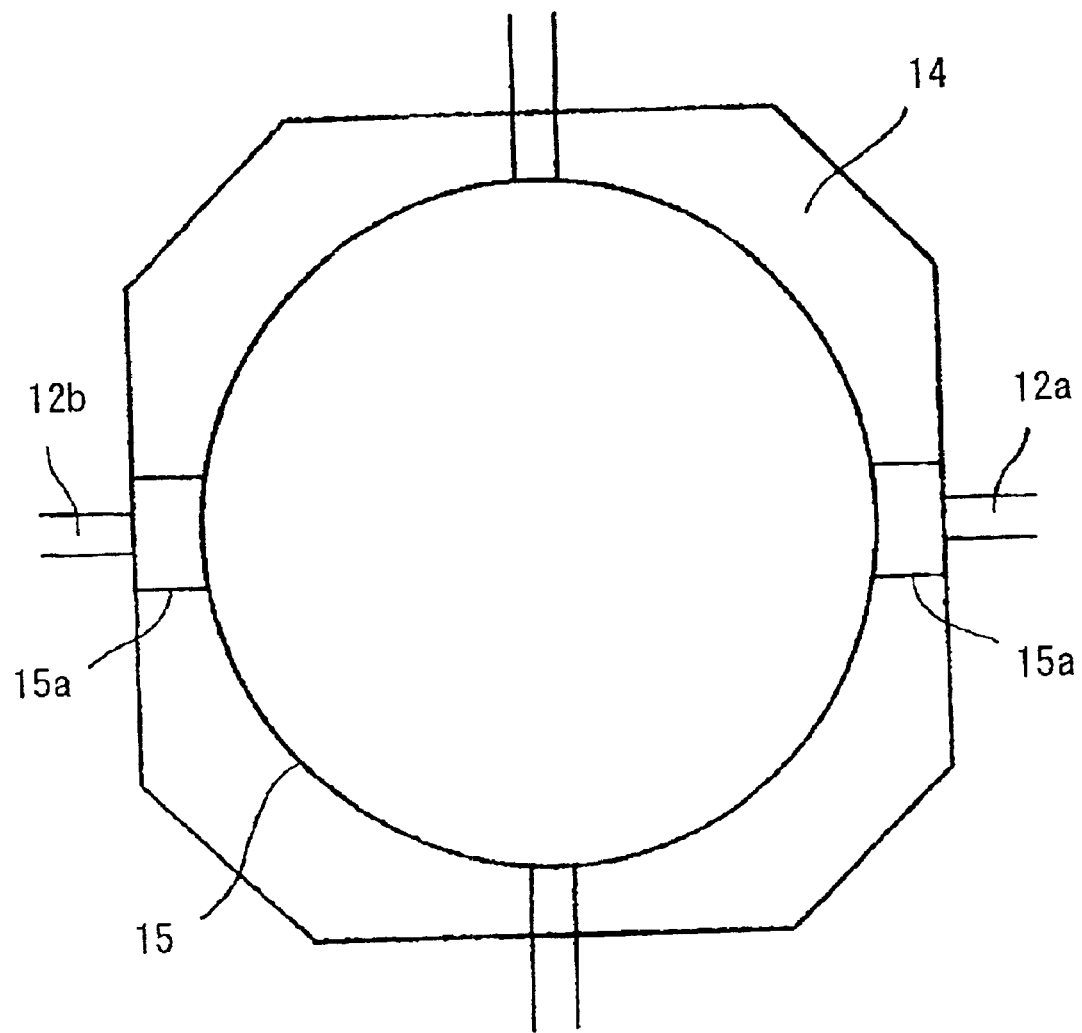
FIG. 3 is a schematic rear view of the same light-emitting diode.

A first embodiment of the present invention will be described below with reference to the attached figures: FIG. 1 gives a schematic front view of a light-emitting diode representing a first embodiment of the present invention; FIG. 2 a schematic cross-sectional view of the light-emitting diode taken along the line A—A in FIG. 1; FIG. 3 a schematic rear view of the light-emitting diode; and FIG. 4 a schematic view of a metal plate to be made into a reflection mirror of the light-emitting diode showing the state thereof before and after coining.

As shown in FIGS. 1, 2 and 3, the light-emitting diode representing the first embodiment comprises a light-emitting element 11, lead assemblies 12a and 12b, a bonding wire 13, a light transmissible material 14, a concave reflection mirror 15 and a radiation surface 21.

The light-emitting element 11 is mounted on one end of the lead array 12a, and the light-emitting element 11 and the lead assembly 12b are electrically interconnected with each other by the boding wire 13. The light-emitting element 11, the tip end portions of the lead assemblies 12 and 13, the bonding wire 13, and the reflection mirror 15 are integrally sealed with the light-transmissible material 14. The light transmissible material 14 might be a transparent epoxy resin.

The lead assemblies 12a and 12b are adapted to supply electric power to the light-emitting element 11. Limbs constituting the lead assembly 12a extend out of the upper and lower ends and of the left end of the diode as seen from FIG. 1. At the intersection at which the vertical limbs and the horizontal limb meet is mounted the light-emitting element 11. A limb constituting the lead assembly 12b extends out of the right end of the diode as seen from FIG. 1. The central end of lead assembly 12b is positioned a certain distance apart from the limb intersection of lead assembly 12a.

The reflection mirror 15 is produced by stamping a metal plate (such as copper or copper alloy plate) to take a smoothly concave surface. The surface is further treated by, for example, plating or vapor deposition based on the use of silver. Here, the concave reflection surface 15 is shaped like approximately a paraboloid of revolution having a focal point at which the center of the light-emitting element 11 is disposed. The lead assemblies 12a and 12b are positioned certain distances apart from the reflection mirror 15 to avoid direct contact. The reflection mirror 15 has at least two protrusions 15a opposite to each other at its circumference as shown in FIG. 2. The protrusions 15a protrude externally in the directions normal to the central axis of the reflection mirror 15. In this embodiment, the circle depicted by the circumference of the reflection mirror 15 has a diameter of about 7.5 mm, and the protrusion has a length of about 0.5 mm.

The radiation surface 21 is formed at the rear side of the light-emitting element 11. More precisely, the surface of the light transmissible material 14, equivalent to the optical path diameter of light reflected on the reflection mirror 15, at the rear side of the light-emitting element 11 is the radiation surface 21. Here, the radiation surface 21 occurs as a plane normal to the central axis of the reflection mirror 15. As described above, in the first embodiment, the position of the light-emitting element 11 and the shapes of the concave reflection surface and the radiation surface 21 are designed such that the light-emitting diode 11 becomes able to emit parallel light.

The first embodiment incorporates a reflection mirror 15 which has been obtained by mirror-surface-treating a copper alloy plate by coining, stamping it to take a concave shape, and plating silver onto the concave surface. Here, coining refers to a process whereby a mirror-ground punch is applied to a metal plate, to generate a mirror surface thereupon.

Figure 4:
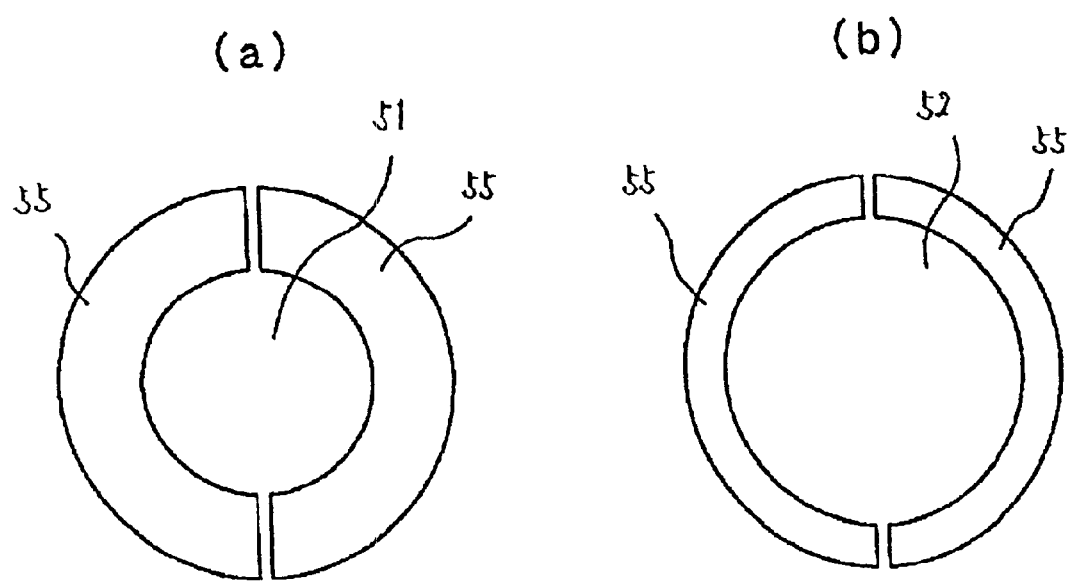
FIG. 4 is a schematic view of a metal plate to be made into a reflection mirror of the light-emitting diode showing the state thereof before and after coining.

Next, the processes involved in coining will be described with reference to FIG. 4. A circular portion 51 to be made into a reflection mirror is designed on a copper alloy plate, and openings 55 are prepared around its circumference as shown in FIG. 4(a). The area of the circular portion 51 at this stage should be made smaller than that of the concave reflection mirror 15 into which the circular portion 51 will be made. Next, a mirror-ground punch is applied by pressure to the circular portion 51, to generate a mirror surface thereupon: during this process, the surface is practically removed of any flaws and widened to have a larger area. FIG. 4(b) shows the enlarged circular portion 52 after coining.

As seen from above, because the circular portion 51 has openings 55 around its circumference before coining which will serve as a space to accommodate the enlargement of the portion during coining, the circular portion 51 can easily enlarge peripherally in the presence of pressure from a mirror-ground punch. This arrangement makes it possible to remove the circular potion 51 of practically all surface flaws as well as distortions which would be otherwise generated in association with the removal of flaws, without requiring a too high pressure. This process ensures the production of a reflection surface excellent in smoothness.

Later, the resulting circular portion 52 is processed by stamping to produce a reflection mirror whose surface is shaped like a paraboloid of revolution. Then, the surface has silver plated thereupon, and the reflection mirror 15 of the first embodiment is now obtained. Plating of silver may occur by wet plating, sputtering or dry plating such as vapor deposition. The reflective surface of the reflection mirror 15 thus produced is sufficiently smooth to satisfy the practical optical requirements, and the scatter of the light reflected from the reflection mirror 15 is greatly suppressed.

Generally, plating is introduced for two purposes: one is to further smoothen the surface as represented by copper or nickel plating, and the other is to enhance the reflectance and improve the bonding as represented by silver plating. Sputtering and vapor deposition are mainly introduced for the purpose of improving the reflectance. In view of this, in this embodiment, it is desirable to produce a reflection mirror using copper or nickel plating followed by silver plating.

Figure 5:
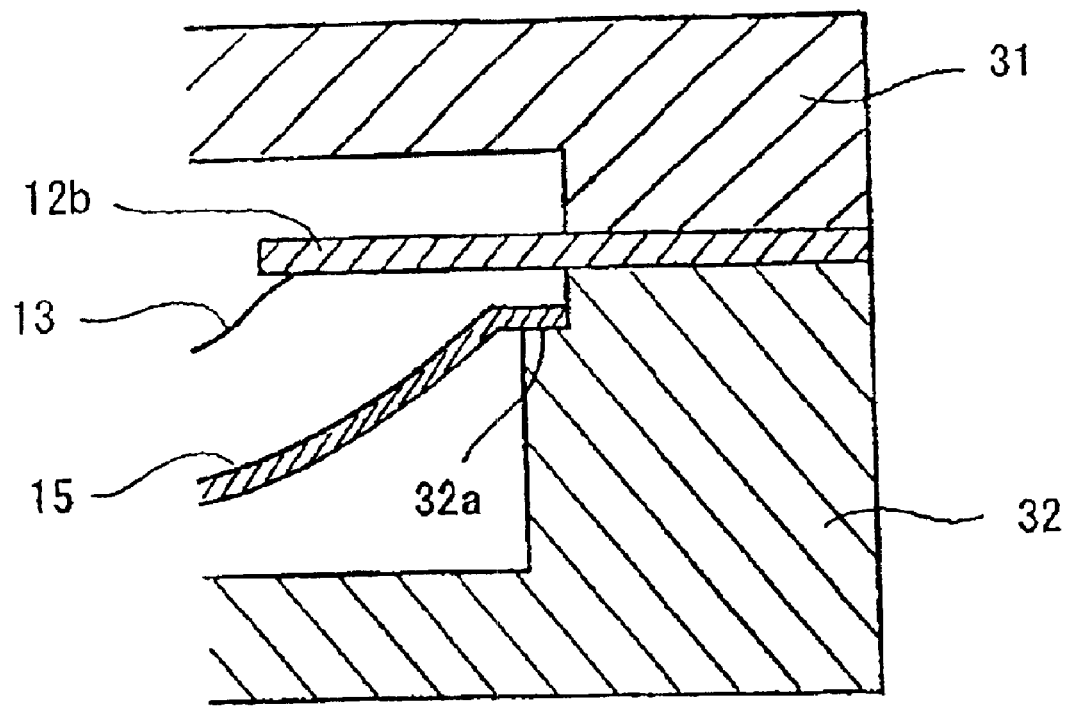
FIG. 5 is a schematic cross-sectional view of a part of the light-emitting diode to illustrate the manner how it is prepared by transfer molding.

Next, the method for fabricating a light-emitting diode 10a according to a first embodiment of this invention will be described. For fabricating a light-emitting diode 10a by this method, a lead frame is prepared, and a light-emitting diode 10a is molded by transfer molding onto the frame. FIG. 5 is an enlarged sectional view of a part of interest of the light-emitting diode to illustrate how the diode is fabricated by transfer molding.

A lead frame to be used for this purpose includes lead assemblies 12a and 12b. A light-emitting element 11 is mounted on a predetermined site of a lead frame 12a. The light-emitting element 11 and the lead assembly 12b are connected with a wire 13 by bonding. Then, a reflection mirror 15 is set in a lower molding die 32 with its concave surface facing upward as shown in FIG. 5. The lower molding die 32 has steps 32a inscribed on the upper portions of its inner walls to receive protrusions 15a of the reflection mirror 15. Thus, the reflection mirror 15 is suspended in the cavity within the lower molding die. The depth of the step is larger than the thickness of the protrusion 15a. The reason why the reflection mirror 15 is placed in the lower molding die 32 with its concave surface facing upward is to prevent the entry of air into the mold.

The lead frame is placed over the lower molding dies 32 after proper alignment. Then, an upper molding frame 31 is laid over the assembly: the lead frame is sandwiched between the upper and lower molding frames 31 and 32 as shown in FIG. 5. At this state, the lead assemblies 12a and 12b are a certain distance apart from the reflection mirror 15.

Then, a liquid transparent epoxy resin is injected into a space formed between the upper and lower molding dies 31 and 32. Then, the resin is allowed to harden, and a mold is removed from the space between the upper and lower molding dies 31 and 32. Later, unnecessary parts are cut out from the lead frame to produce a light-emitting diode 10a as represented by FIGS. 1, 2 and 3.

Such transfer molding as described above allows the radiation surface 21 to be precisely formed in a positional relation with the light-emitting element 11 because it allows the radiation surface 21 to be formed while the lead frame is firmly fixed by the molding dies between the molds.

In the light-emitting diode 11 thus arranged, when the light-emitting element is energized, the light emitting element is excited to produce light. Light produced from the light-emitting element 11 is reflected by the reflection mirror 15, and then radiated from the radiation surface 21 to the outside. In particular, since the reflection mirror 15 is of approximately the paraboloid of revolution and the center of the light-emitting surface of the light-emitting element 11 is disposed at its focal point, light passed through the radiation surface 21 is radiated to outside as parallel light. The radiation surface 21 has a smoothness approximately the same with that of the mirror surface of the molding die during sealing, and thus light reflected on the reflection mirror 15 is prevented from scattering at the radiation surface 21.

In this embodiment as described above, light emitted by the light-emitting element 11 is reflected on the reflection mirror 15 and then radiated to the outside. Therefore, the light-emitting diode 11 has characteristics that it is high external radiation efficiency, and high luminance/high luminous intensity. In addition, since light emitted from the light-emitting element 11 is controlled only by the concave reflection surface 18, the irradiation distribution of the light-emitting diode 11 itself has no deviated irradiation patterns and the degree of the uneven irradiation is small, thereby making it possible to improve a uniformity ratio of illuminance.

While the concave reflection surface is shaped like the paraboloid of revolution according to the first embodiment, the reflection mirror may be shaped like any form to give desired light radiation characteristics including light distribution. The mirror surface may, for example, be shaped like a circle of revolution or an eclipse of revolution, thereby allowing light emitted by the light-emitting element to be reflected on the reflection mirror and then to be concentrated onto a spot.

Since the concave reflection mirror incorporated in the light-emitting diode of the first embodiment has been obtained by stamping a metal plate, it is resistive to thermal changes, and will not develop any wrinkles on its surface or be free from any damages even in the presence of high temperatures. Because of this, packing such light-emitting diodes into a pattern and wiring them can be achieved by using a reflow furnace containing solder melt. Since light-emitting diodes of the first embodiment produced as described above do not impose any restrictions even when they are packed into a pattern, they are particularly suitable for an application where a large number of them are packed into a pattern.

Particularly with respect to the light-emitting diode of the first embodiment, the whole assembly of the concave reflection mirror is sealed with the light transmissible material. Thus, the concave reflection mirror has not only its reflection surface but its rear surface sealed with the light transmissible material. Because of this, if wiring such light-emitting diodes packed into a pattern is achieved by using a reflow furnace, it will be possible to prevent the diodes from being subject to the defects such as separation of the interface, and to make them more amenable to mass production than the diodes similarly packed with, however, their rear sides being kept exposed.

Even the light-emitting diode incorporating a reflection mirror whose rear side is exposed is more amenable to mass production than similar conventionally prepared light-emitting diodes, because it allows, when it is prepared by molding, the light transmissible material to seal the light-emitting element and a part of the lead assembly, and at the same time to serve itself as the radiation surface. This makes it possible to easily produce the light-emitting diodes by using conventional apparatuses, and thus to produce them in a large mass. Indeed, the light-emitting diode of the first embodiment will allow mass production as easily as the light-emitting diode of a second embodiment of the prior art.

With the light-emitting diode of the first embodiment, the reflection mirror is prepared from a metal plate, and the reflection mirror has at least two protrusions at its circumference opposite to each other which run in parallel with the limbs of one lead assembly. Because it is possible to firmly hold the reflection mirror with respect to the molding dies during molding by making use of the protrusions, the light-emitting element and the reflection mirror can be positioned with respect to each other with a high accuracy during fabrication of the light-emitting diode through molding. Usage of a metal plate as a material of the reflection mirror allows heat generated by the light-emitting element to be transmitted through the lead assemblies to the reflection mirror and the protrusions, even though the lead assemblies are not in direct contact with the reflection mirror, and thus it improves the heat radiation property of the diode. The diode, even if its reflective mirror has no such protrusions, will still possess enhanced heat radiation property.

Moreover, since the light-emitting diode of the first embodiment is devoid of the resin-coated portion unlike the light-emitting diode of the second embodiment of the prior art, it is naturally free from the problems caused by the presence of such a resin-coated portion.

The light-emitting diode of the first embodiment incorporates the reflection mirror which has been obtained by mirror-surface-treating a metal plate by coining, and processing the plate to take a concave shape. The reflection mirror prepared as above has a surface sufficiently smooth to be optically workable, although it still possesses microscopic flaws. Because of this, scattering at the reflection mirror of light emitted by the light-emitting element is greatly suppressed, and thus nearly the entire amount of light is radiated to the front.

Although description has been given of the first embodiment which incorporates the reflection mirror which has been obtained by preparing a mirror on the concave surface of a metal plate, preparation of a mirror on the concave surface of a metal plate is not always necessary as long as the metal has a sufficient reflectance. In other words, a metal plate which has a sufficiently high reflectance being processed to take a concave shape can serve as the reflection mirror.

Although description has been given of the first embodiment which incorporates the reflection mirror which has been obtained by processing a metal plate, the reflection mirror may be made, for example, from white ceramic, or a ceramic material whose surface has been plated with a metal, or may be obtained by applying an under-coat over a plate of a heat resistant resin for enhanced bonding, and plating a metal over the assembly by vapor deposition. However, it is desirable to use a metal plate as a material of the reflection mirror, considering that the reflection mirror is exposed to high temperatures while it is set in molds and sealed with the light transmissible material there, or that the reflection mirror made from other material than a metal may damage the molds.

Next, a second embodiment of the present invention will be described. The front view, sectional view and rear view of a light-emitting diode according to the second embodiment are the same with those in FIGS. 1, 2 and 3. Thus, those views are omitted here, and the following description will be advanced with reference to FIGS. 1, 2 and 3 as needed. Elements and parts of the second embodiment having the same functions with the corresponding elements of FIGS. 1, 2 and 3 will be represented by the same symbols, and their detailed explanation will be omitted.

A light-emitting diode of the second embodiment differs from that of the first embodiment in that it incorporates a reflection mirror 15 which has been obtained by stamping a mirror-surface-treated aluminum plate (or aluminum alloy plate). Here, the method for mirror-surface-treating a aluminum plate includes a special rolling which will not leave any notable flaws on rolled plates. To be concrete, the method includes mirror-surface rolling or a variant of pressure rolling: the method consists of bringing an adhesive roll in contact either with the surfaces of mirror-face rollers, or with at least one face of an aluminum material to be rolled, and of rolling the material under pressure, thereby obtaining a highly polished plate practically free from any flaws and removed of aluminum powder.

An alternative method consists of coining an aluminum plate which has been obtained by ordinary rolling, thereby causing it to take a mirror-surface-treated state. A mirror-surface-treated aluminum plate obtained by coining is sufficiently smooth to satisfy the practical optical requirements, although it still possesses microscopic flaws.

The reflection mirror 15 is made of an aluminum plate which has been processed as described above, with attention having been paid such that it has a linear reflectance of 85%, it maintains a sufficient surface smoothness, and its surface is shaped like approximately the paraboloid of revolution. If the reflection mirror incorporates an aluminum plate having a high linear reflectance, it will be needless to apply surface treatment on the concave surface of the plate such as metal plating. Thus, since the reflection mirror 15 has a reflective surface which is sufficiently mirror-surface-treated, and an optically satisfactory smoothness, it prevents the scattering of incident light. Moreover, since an aluminum mirror has a high reflectance to the rays whose wavelengths fall in the visible to ultraviolet regions, the reflection mirror 15 incorporating such a mirror also has a high reflectance to those rays, thereby ensuring a high radiation efficiency.

The reflection mirror 15 of the second embodiment may be configured as follows: the circle depicted by the circumference of the reflection mirror 15 has a diameter of about 5 mm or 7.5 mm, and the plate has a thickness of about 0.3 mm. If the diameter of the circle depicted by the circumference of the reflection mirror 15 is smaller than 5 mm, it will be desirable to reduce the thickness of the reflection mirror 15 below 0.3 mm. As the distance between the plane defined by the circumference of the reflection mirror 15 and the center of the reflection mirror 15 is made larger, it is desirable to increase the thickness of the plate of the reflection mirror 15. In practice, the reflection mirror 15 may have a thickness of 0.1 to 0.5 mm.

Other configurations of the second embodiment are the same with those of the first embodiment. The light-emitting diode of the second embodiment may be produced by the same method as used in the first embodiment.

With the light-emitting diode of the second invention, the reflection mirror is obtained by stamping an aluminum material having a high linear reflectance, so that it is possible to dispense with surface treatment such as metal plating. The above method also dispenses with the necessity of maintaining the reflectance of the mirror surface which, if obtained by silver plating, might undergo blackening leading to the lowering of the reflectance. This may contribute to the simplification of the maintenance works. Moreover, because aluminum is widely used for a variety of applications, it is easily available. Other advantages are the same with those of the first embodiment.

Description has been given above about the second embodiment which incorporates, as a material of the reflection mirror to radiate parallel light to the outside, an aluminum plate having a linear reflectance of 85%. Since a reflection type light-emitting diode can radiate parallel light three times as high in intensity as that from a lens type light-emitting diode, it will ensure optical performance better than the lens type counterpart even if loss of radiation due to reflectance at the radiation surface is taken into account, as long as its reflection mirror is made of an aluminum plate having a linear reflectance of about 60% or higher. If the light-emitting element were not sealed with a light transmissible material, loss of radiation due to refraction at the radiation surface would be eliminated, but the irradiation efficiency of light emitting by the light-emitting element would lower. Therefore, it will be still desirable to use a reflection mirror made of an aluminum plate having a linear reflectance of 65% or higher.

Figure 6:
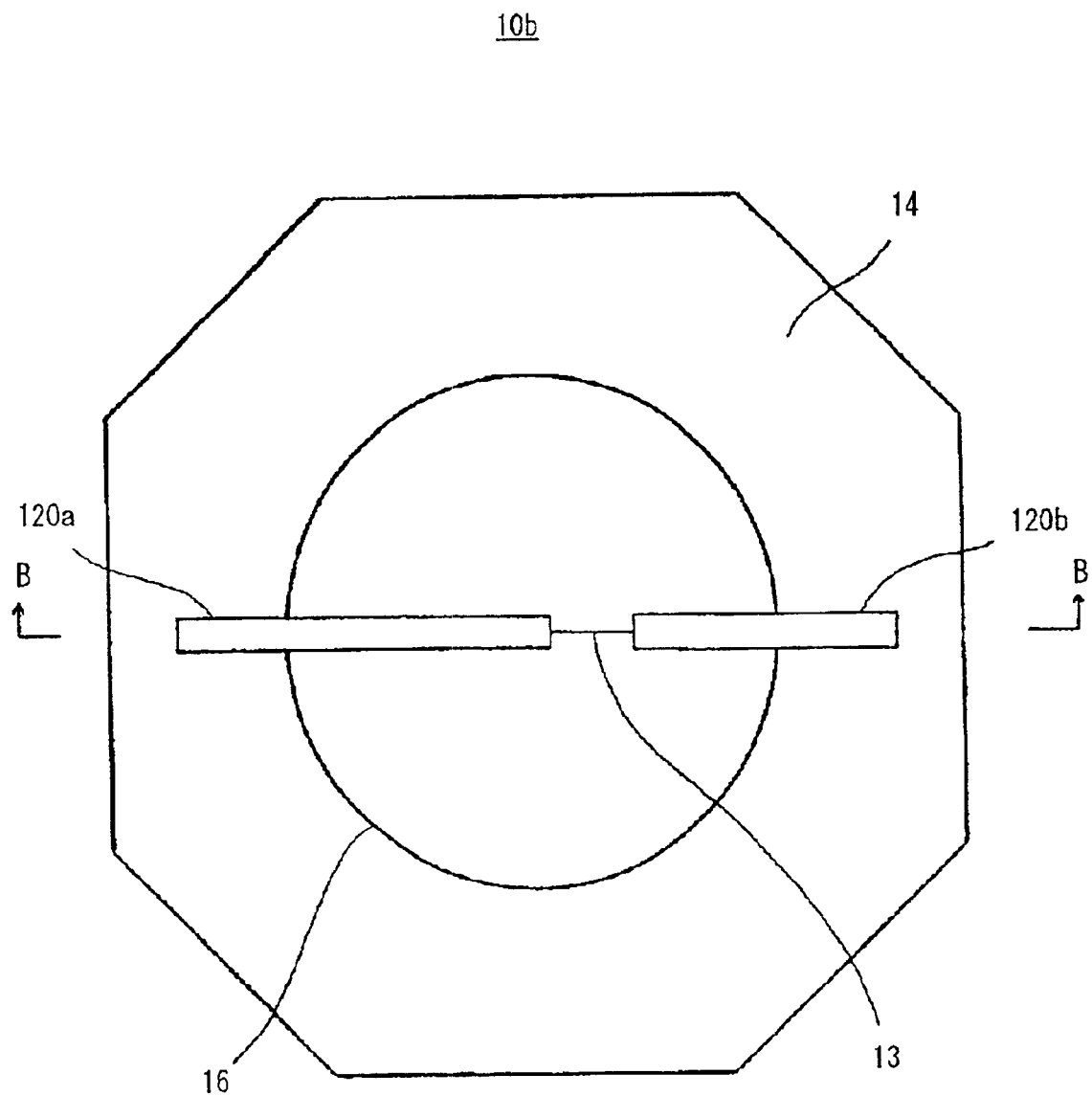
FIG. 6 is a schematic front view illustrating a light-emitting diode according to a third embodiment of the present invention.
Figure 7:
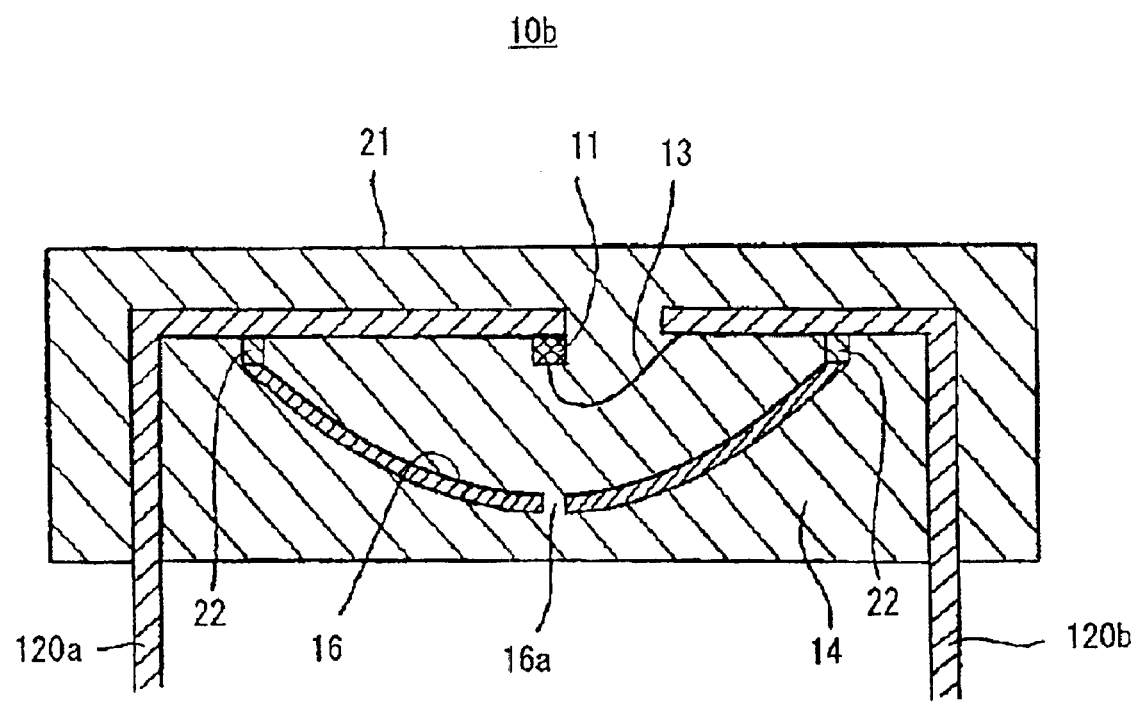
FIG. 7 is a schematic cross-sectional view of the light-emitting diode taken along the line B—B in FIG. 6.

Next, a third embodiment of this invention will be described with reference to the attached figures. FIG. 6 is a schematic front view of a light-emitting diode according to the third embodiment of this invention; FIG. 7 a cross-sectional view of the same light-emitting diode taken along the line B—B; and FIG. 8 a schematic rear view of the same light-emitting diode. In the third embodiment, elements and parts having functions identical to those of the first embodiment are marked with the same reference numerals, and therefore need not be described in detail.

Figure 8:
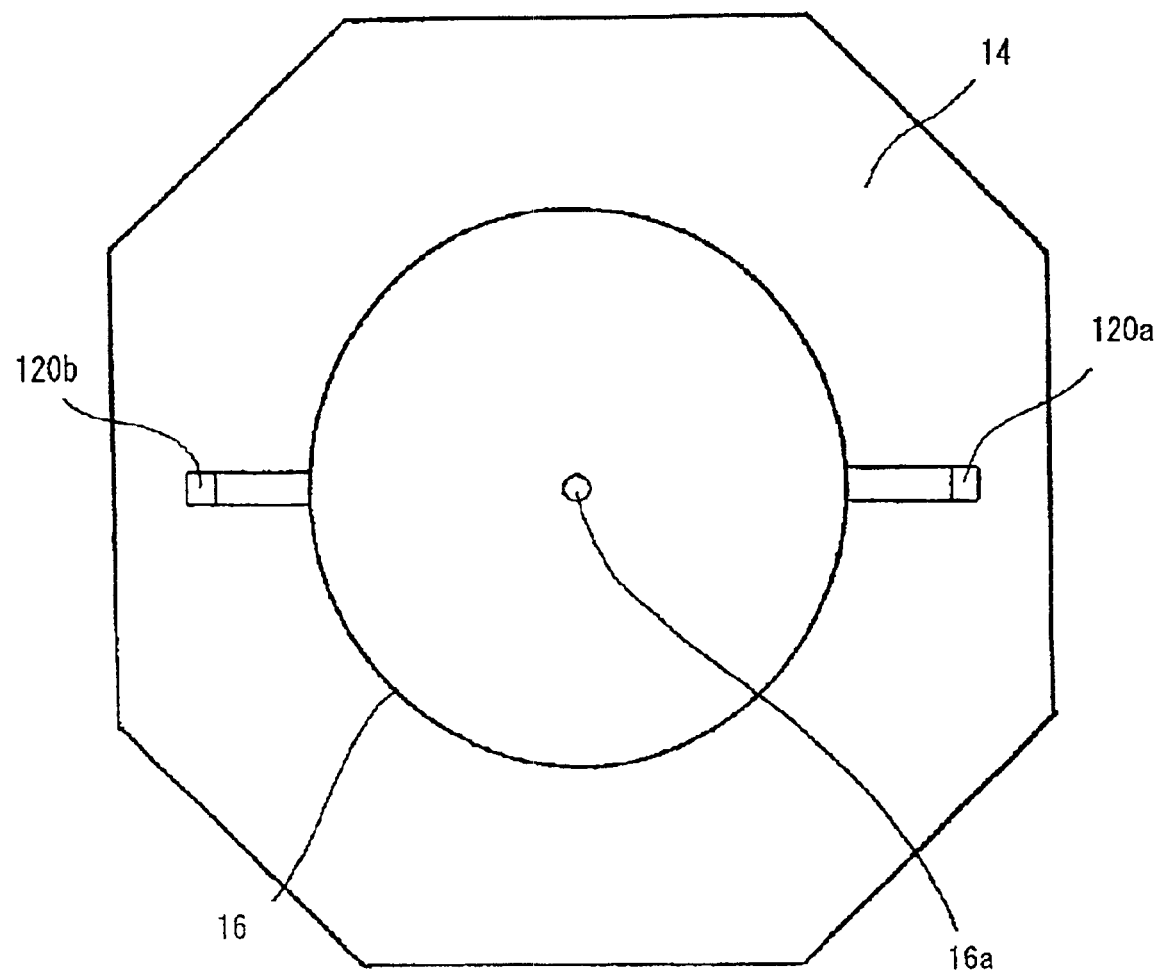
FIG. 8 is a schematic rear view of the same light-emitting diode.

As shown in FIGS. 6, 7 and 8, a light-emitting diode according to the third embodiment comprises a light-emitting element 11, lead assemblies 120a and 120b, a bonding wire 13, a light transmissible material 14, a concave reflection mirror 16, a radiation surface 21, and an insulating material 22.

The light-emitting element 11 is mounted on one end of the lead assembly 120a, and the light-emitting element 11 and the lead assembly 120b are electrically interconnected by the bonding wire 13. The light-emitting element 11, the tip end portions of the lead assemblies 120a, 120b and the bonding wire 13, the reflection mirror 16 and the insulating material 22 are integrally sealed by the light transmissible material 14. Pieces of the insulating material 22 are inserted between the lead assemblies 120a, 120b and the reflection mirror 16.

The lead assemblies 120a and 120b are adapted to supply electric power to the light-emitting element 11. The limb ends of lead assemblies 120a, 120b are bent in the reflection mirror side 16 and are drawn out from the underside of the light transmissible material 14 as shown in FIG. 7.

The reflection mirror 16 is obtained, as in the first embodiment, by processing a metal plate by stamping to take a smooth, concave shape, and then plating or depositing silver and such on its surface. Here, the reflection mirror 16 is shaped like approximately a paraboloid of revolution having a focal point at which the center of the light-emitting element 11 is disposed. However, in contrast with the first embodiment, the reflection mirror 16 of the third embodiment has a penetrating hole 16a on its center. The penetrating hole 16a preferably has a diameter smaller than the width of lead assembly 120a or 120b. The reflection mirror 16 has no protrusion at its circumference.

Certainly, the reflection mirror 16 loses its part by having the penetrating hole 16a on its center, but the loss is very small relative to the whole area of the reflection mirror 16, and, even if the hole were not prepared and the central mirror part which otherwise would be lost could reflect light, that reflected light would be intercepted by the light-emitting element and could not be radiated to the outside. Thus, the effects that the presence of the penetrating hole 16a will exert on the irradiation efficiency of the diode, and on the light-emitting activity of the diode are negligible.

Figure 9:
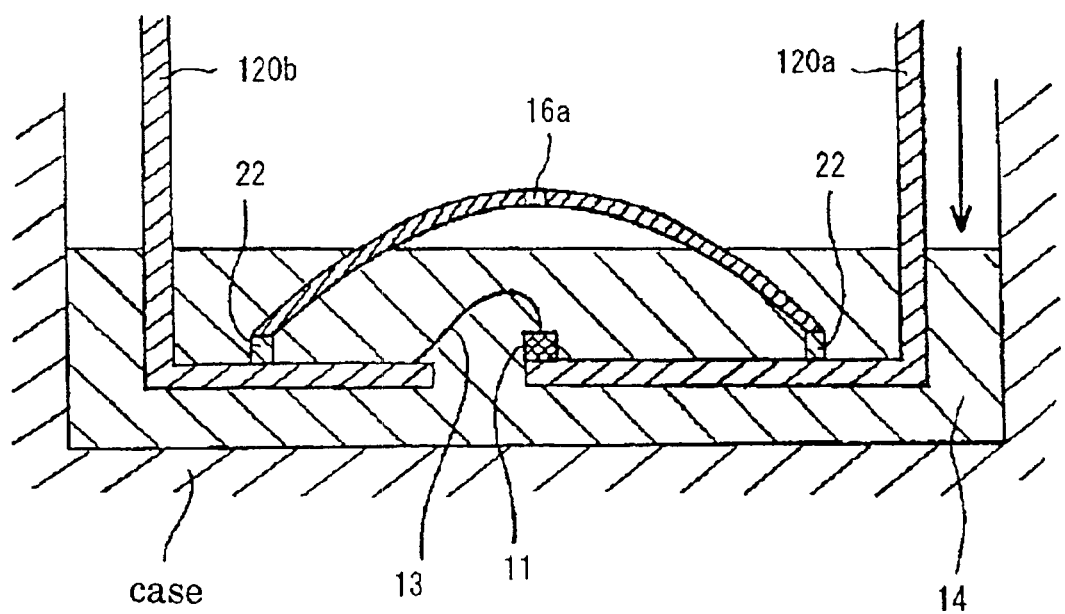
FIG. 9 is a schematic cross-sectional view of the light-emitting diode to illustrate the manner how it is prepared by pot molding.

Processes for manufacturing a light-emitting diode 10b according to the third embodiment will be described. Here, potting molding is used for the manufacture of such a light-emitting diode 10b. FIG. 9 is a schematic cross-sectional view of a light-emitting diode 10b illustrating the manner how it is produced by potting molding.

In this instance, firstly, a light-emitting element 11 is mounted on a predetermined site of a lead assembly 120a. The light-emitting element 11 and the lead assembly 120b are connected with a wire 13 by bonding. Then, the limbs of the lead assemblies 120a, 120b are bent at the predetermined sites towards the light-emitting element 11. The light-emitting element 11 is set in a case prepared for the purpose with its light-emitting surface facing upward, and maintained there by having the tip ends of lead assemblies 120a, 120b held with clamps. Later, the reflection mirror 16 is set in the same case with its concave surface facing downward in such a way as to take a predetermined position with respect to the lead assemblies 120a, 120b where the reflection mirror 16 comes into contact with the lead assemblies by way of insulating material 22.

Next, a liquid transparent epoxy resin is allowed to fall dropwise from a corner of the case into its cavity as indicated by the arrow in FIG. 9. During this process, air accumulated in the cavity of the reflection mirror 16 is vented through the penetrating hole 16a. The resin, after being injected into the case, is allowed to harden, and the mold is removed from the case. A light-emitting diode 10 as depicted in FIGS. 6, 7 and 8 is now obtained.

Such potting molding as described above allows not only sealing of the light-emitting element 11, lead assemblies 120a and 120b, and the reflection mirror 16, but preparation of the radiation surface 21. Potting molding may be applied to a wide variety of resins as compared with transfer molding, and thus allows the selection of resins most appropriate for a given application.

Manufacture of a light-emitting diode 10b according to the third embodiment may be based on transfer molding as in the first embodiment. In transfer molding, the radiation surface may be molded with an upper molding die, as well as with a lower molding die. This is because the third embodiment incorporates the reflection mirror 16 which has the penetrating hole 16a on its center and thus accumulation of air in the cavity of the reflection mirror 16 during molding can be avoided. Generally, if a light transmissible material is molded with an upper molding die to give a flat radiation surface, the presence of a residual air layer in the die will cause a concavity to develop on the radiation surface after hardening of the resin. However, this can be avoided by molding the resin in an lower molding die to give a radiation surface, and thus it is possible to improve the accuracy of the radiation surface, and to manufacture the radiation surface faithfully as designed.

The light-emitting diode of the third embodiment may incorporate a reflection mirror which has been obtained by processing a metal plate by stamping as in the first embodiment to take a concave shape. Then, the resulting reflection mirror will be so resistive to thermal changes that it will not develop wrinkles and such or receive any damages on its surface even in the presence of high temperatures. Because of this, wiring the light-emitting diodes packed into a pattern can be safely achieved by using a reflow furnace containing solder melt. Even the light-emitting diode incorporating a reflection mirror prepared from a metal surface by stamping will ensure production based on the use of conventional apparatuses, as long as the light-emitting element, parts of lead assemblies, and the reflection mirror are sealed during molding with a light transmissible material, so as to make one surface of the light transmissible material serve as a radiation surface. This will ensure mass production of the light-emitting diode.

The light-emitting diode of the third embodiment has another advantage: the reflection mirror, because it has a penetrating hole on its center, allows a wider freedom than otherwise possible for manufacture. Thus, the light-emitting diode can be produced by potting molding as well as by transfer molding because, even if the reflection mirror, being placed in the upper side of the lead assemblies, is sealed together with a light-emitting element and lead assemblies by a resin, air will not accumulate in the cavity of the reflection mirror. If such a light-emitting diode is produced by transfer molding, a lower molding die is used for molding a resin to give a radiation surface. Thus, it will be possible to improve the molding accuracy of the radiation surface, and to avoid the adverse effects that a residual air layer possibly present in the die will exert on the configuration of the radiation surface which, if left uncorrected, would affect the radiation characteristics of the radiation surface.

Figure 10:
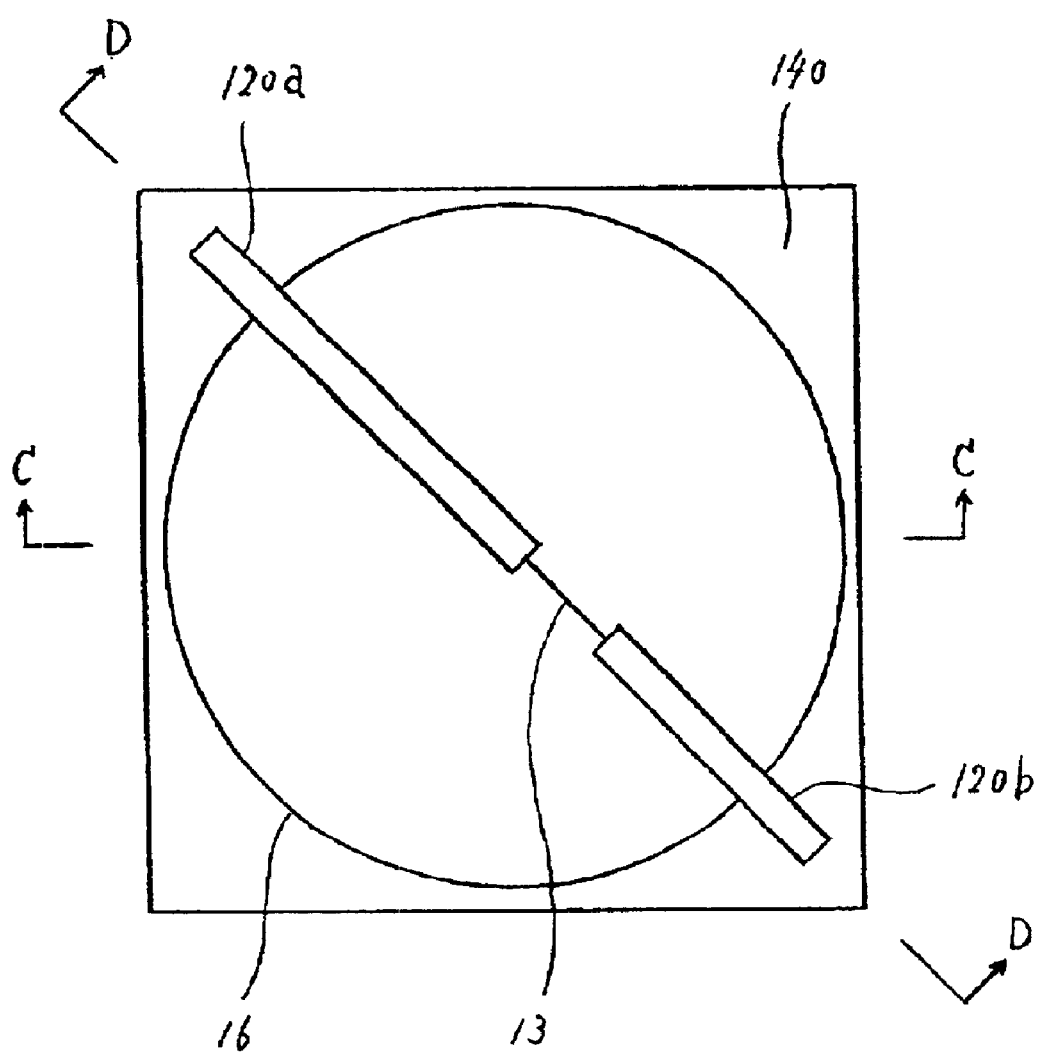
FIG. 10 is a schematic front view illustrating a light-emitting diode according to a fourth embodiment of the present invention.
Figure 11:
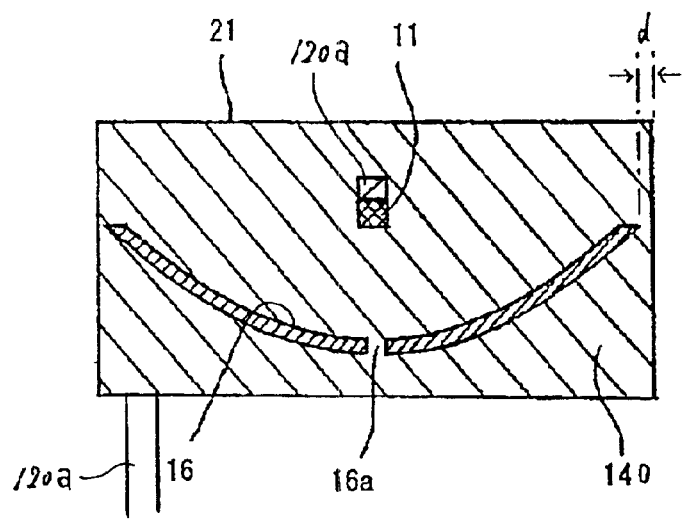
FIG. 11 is a schematic cross-sectional view of the light-emitting diode taken along the line E—E in FIG. 10.
Figure 12:
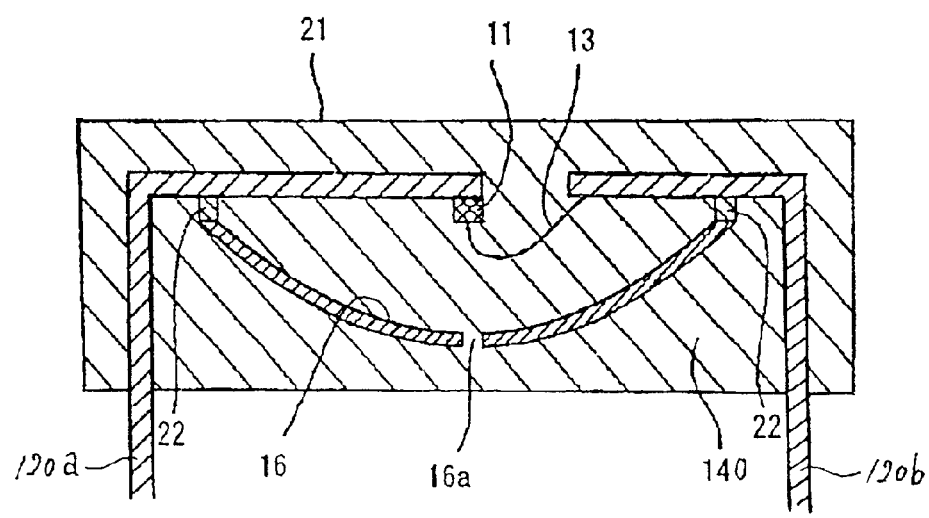
FIG. 12 is a schematic cross-sectional view of the light-emitting diode taken along the line F—F in FIG. 10.
Figure 13:
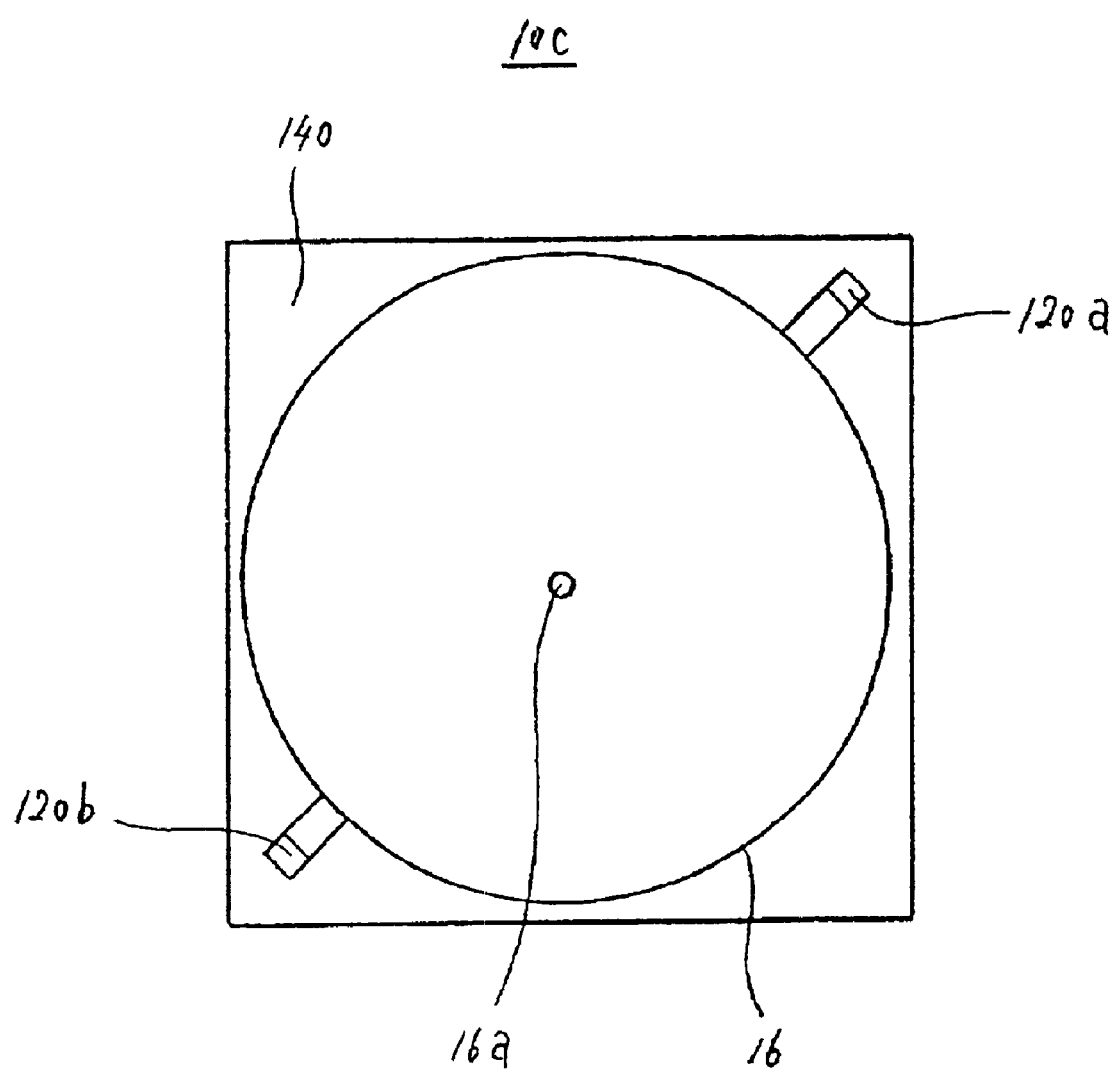
FIG. 13 is a schematic rear view of the same light-emitting diode.

Next, a fourth embodiment will be described with reference to the attached figures. FIG. 10 is a schematic front view of a light-emitting diode according to the third embodiment of this invention; FIG. 11 a cross-sectional view of the same light-emitting diode taken along the line C—C; FIG. 12 a cross-sectional view of the same light-emitting diode taken along the line D—D; and FIG. 13 a schematic rear view of the same light-emitting diode. In the fourth embodiment, elements and parts having functions identical to those of the third embodiment are marked with the same reference numerals, and therefore need not be described in detail.

As shown in FIGS. 10, 11, 12 and 13, a light-emitting diode 10c according to the fourth embodiment comprises a light-emitting element 11, lead assemblies 120a and 120b, a bonding wire 13, a light transmissible material 140, a concave reflection mirror 16, a radiation surface 21, and an insulating material 22.

A light-emitting diode 10c of the fourth embodiment differs from that of the third embodiment in that its light transmissible material has a rectilinear shape as shown in FIG. 10, and in that the lead assemblies 120a, 120b are allowed to depart from the underside of the light transmissible material 140 to the outside. To be concrete, a limb of the lead assembly 120a extends towards the upper left corner and is bent there to go to the outside while a limb of the lead assembly 120b extends towards the lower right corner and is bent there to go to the outside.

The interval d between the side wall of the light transmissible material 140 and the edge of the reflection mirror 16 is made as small as possible as shown in FIG. 11. Specifically, the interval d between the edge of the reflection mirror 16 and the side wall of the block sealed with the light transmissible material 140 should be made less than 1.0 mm. This arrangement will allow the elbows of the limbs of lead assemblies 120a, 120b to be positioned close to the edge of the reflection mirror 16, thereby further reducing the size of a resulting light-emitting diode 10c.

Other configurations may be made the same with those of the third embodiment. The light-emitting diode 10c of the fourth embodiment may be fabricated by the same method as described above in relation to the third embodiment.

The light-emitting diode of the fourth embodiment, when seen from above, takes a rectilinear shape, and the limbs of the lead assemblies are drawn out from the underside of the light transmissible material at the opposite corners of the rectangle. With this arrangement, it is possible for the transverse width of the light transmissible material to be a bit larger than the diameter of the circle defined by the circumference of the reflection mirror. When such light-emitting diodes are arrayed into a grid pattern, they will allow dense packing because the unit interval can be made close to the diameter of the circle defined by the circumference of the reflection mirror of the unit diode. This is an advantage. Other advantages are the same with those of the third embodiment.

Figure 14:
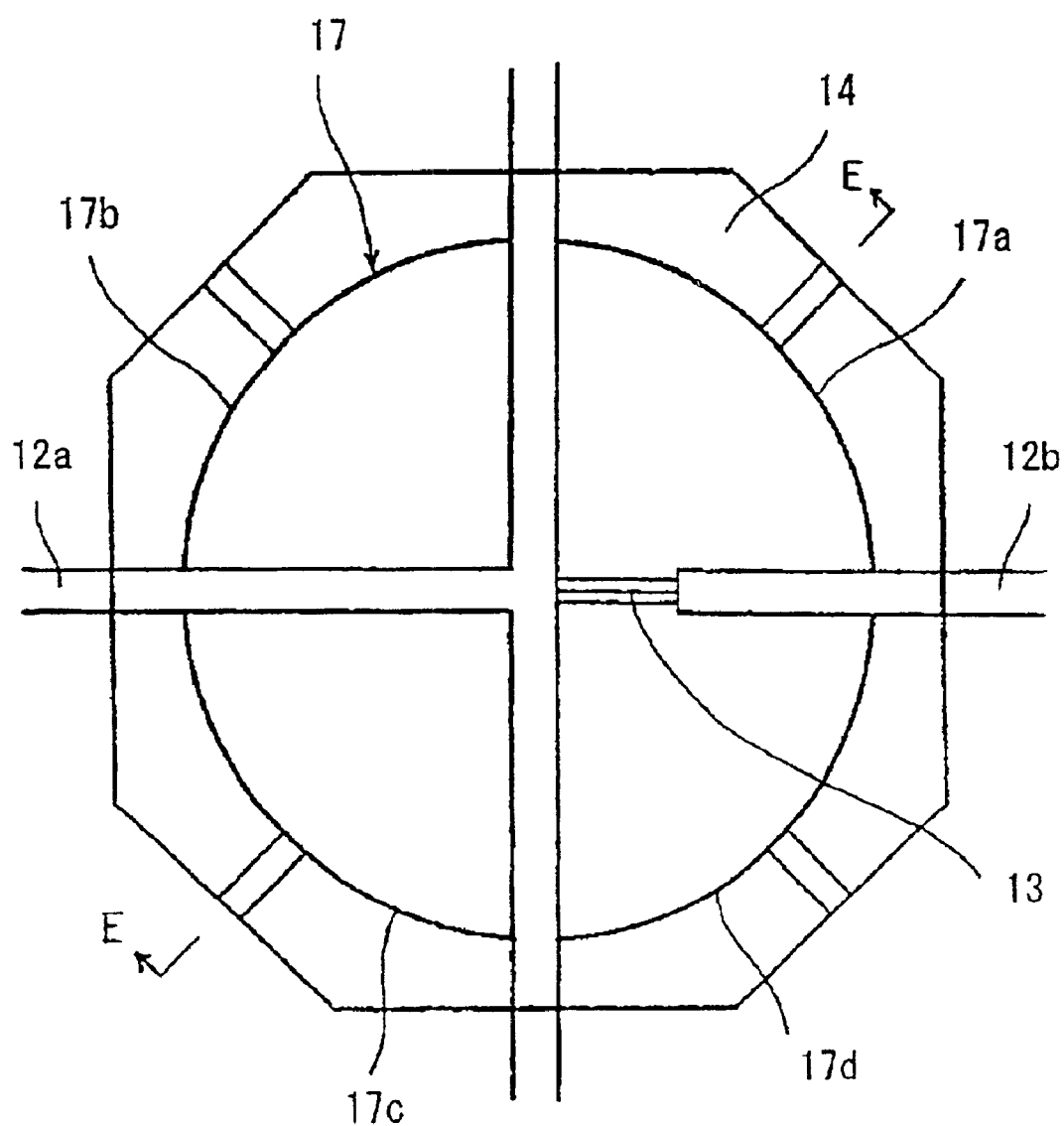
FIG. 14 is a schematic front view illustrating a light-emitting diode according to a fifth embodiment of the present invention.
Figure 15:
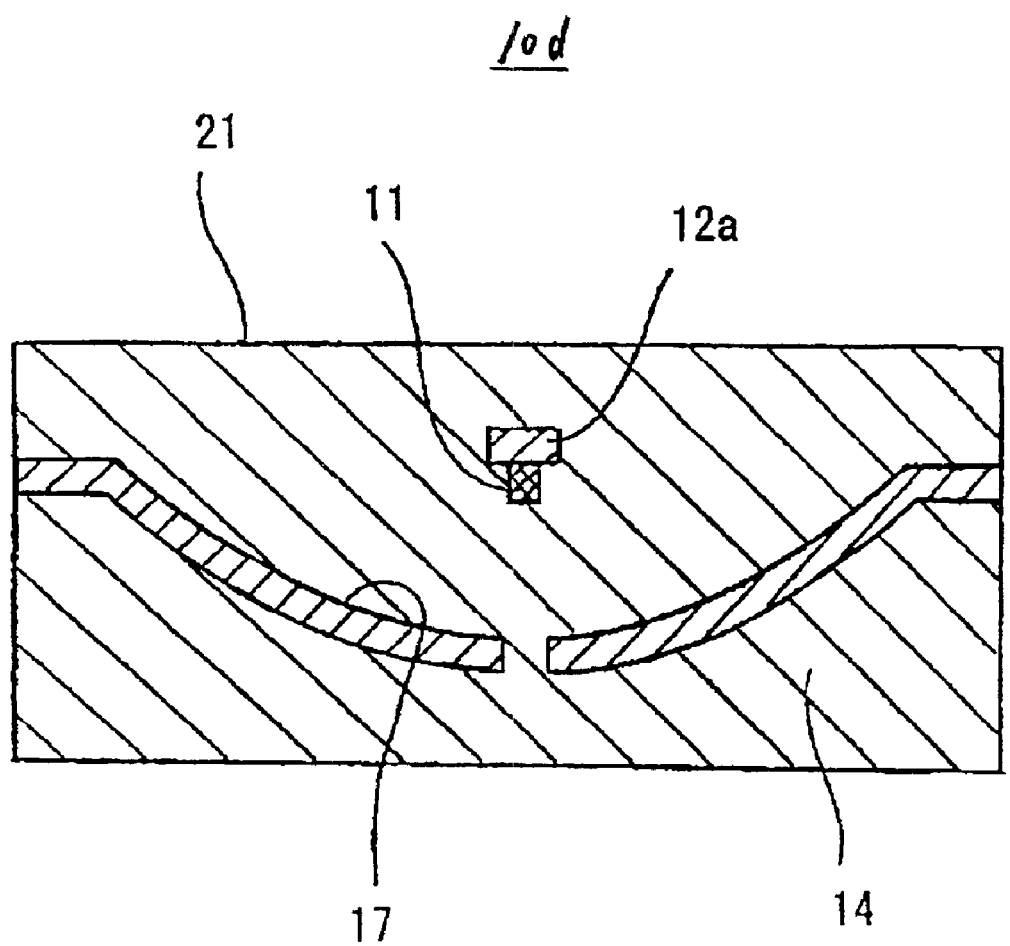
FIG. 15 is a schematic cross-sectional view of the light-emitting diode taken along the line C—C in FIG. 14.

Next, a fifth embodiment will be described with reference to the attached figures. FIG. 14 is a schematic front view of a light-emitting diode according to the fifth embodiment of this invention; FIG. 15 a cross-sectional view of the same light-emitting diode taken along the line E—E; and FIG. 16 a schematic rear view of the same light-emitting diode. In the fifth embodiment, elements and parts having functions identical to those of the first embodiment are marked with the same reference numerals, and therefore need not be described in detail.

Figure 16:
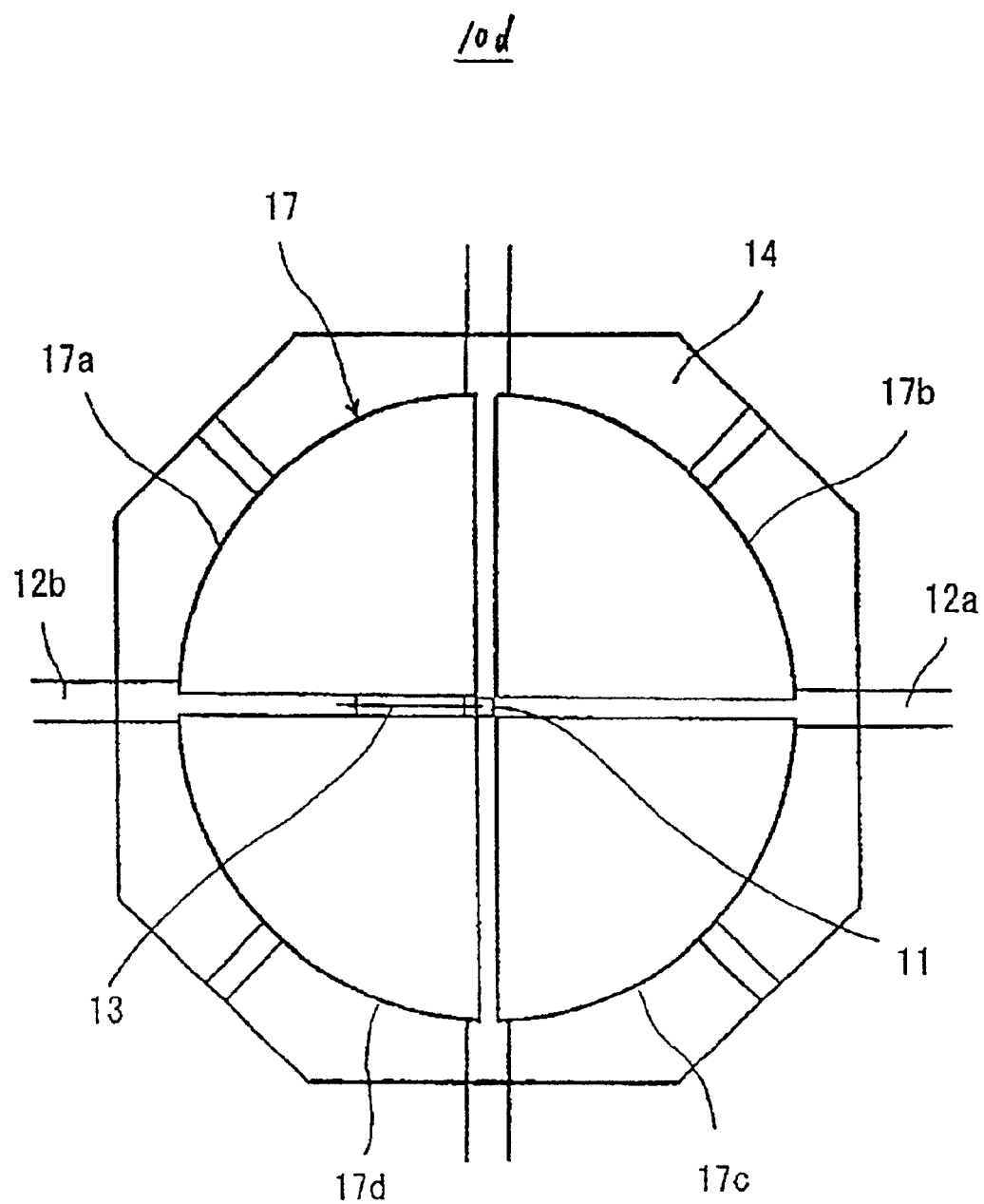
FIG. 16 is a schematic rear view of the same light-emitting diode.

As shown in FIGS. 14, 15 and 16, a light-emitting diode 10d according to the fifth embodiment comprises a light-emitting element 11, lead assemblies 12a and 12b, a bonding wire 13, a light transmissible material 14, a concave reflection mirror 17, and a radiation surface 21. The light-emitting element 11, parts of lead assemblies 12a and 12b, the wire 13 and the reflection mirror 17 are integrally sealed with a light transmissible material 14.

The reflection mirror 17 is a combination of four reflection mirror fragments 17a, 17b, 17c and 17d, each of which has been processed by stamping to take a concave shape. Each of the reflection mirror fragments 17a, 17b, 17c and 17d has received surface treatment such as silver plating or silver deposition. Practically, each fragment of the reflection mirror 17 may be compared to a quadrant of the reflection mirror of the first or the third embodiment. Each of the reflection mirror fragments 17a, 17b, 17c and 17d has a fan-like shape with a central angle of about 90°, and is made of the same metal as with the lead assemblies 12a, 12b. The reflection mirror fragments 17a, 17b, 17c and 17d are arranged practically in a circle when viewed from the rear side as shown in FIG. 16. The interval between adjacent reflection mirror fragments is made smaller than the width of lead assembly 12a or 12b.

The reflection surface 17 is shaped like approximately a paraboloid of revolution having a focal point at which the center of the light-emitting element 11 is disposed. At that position, the gaps between adjacent reflection mirror fragments 17a, 17b, 17c and 17d face opposite to the corresponding lead assemblies 12a and 12b, as shown in FIGS. 14 and 16. Even if the reflection mirror 17 has no gap at a position corresponding to the lead assembly 12a or 12b that otherwise would be inserted, and that intact mirror strip reflects light, that reflected light would be intercepted by the lead assembly 12a or 12b, and could not be radiated to the outside. Thus, the effects that the presence of the gaps will exert on the irradiation efficiency of the reflection mirror will be minimized.

Next, processes for manufacturing a light-emitting diode 10d according to the fifth embodiment will be described. The method for producing a light-emitting diode 10d includes the use of a lead frame which comprises lead assemblies 12a and 12b, and four fan-shaped portions corresponding with the reflection mirror fragments 17a, 17b, 17c and 17d.

Figure 17:
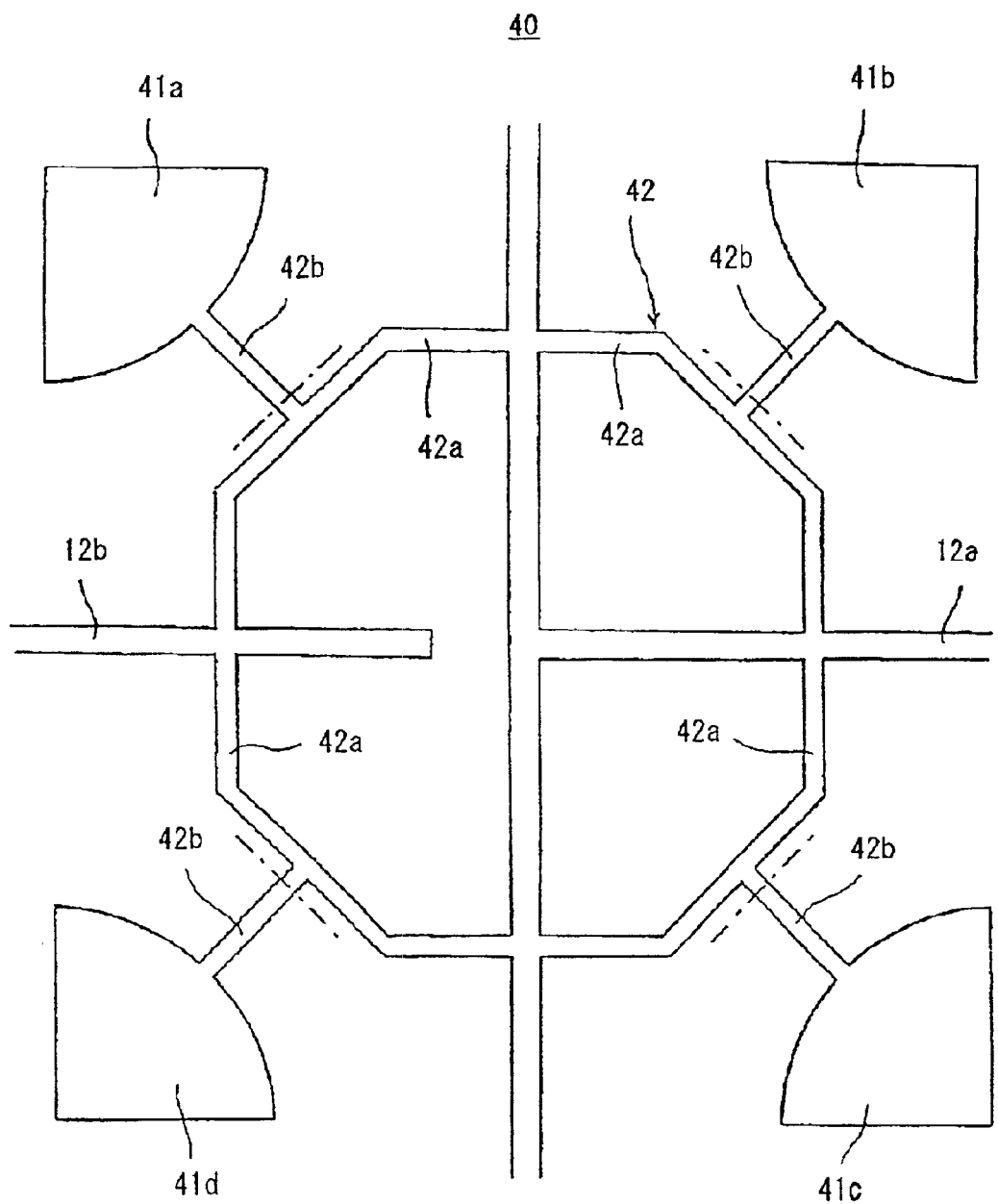
FIG. 17 is a schematic front view of a part of a lead frame to be used for the manufacture of the light-emitting diode.
Figure 18:
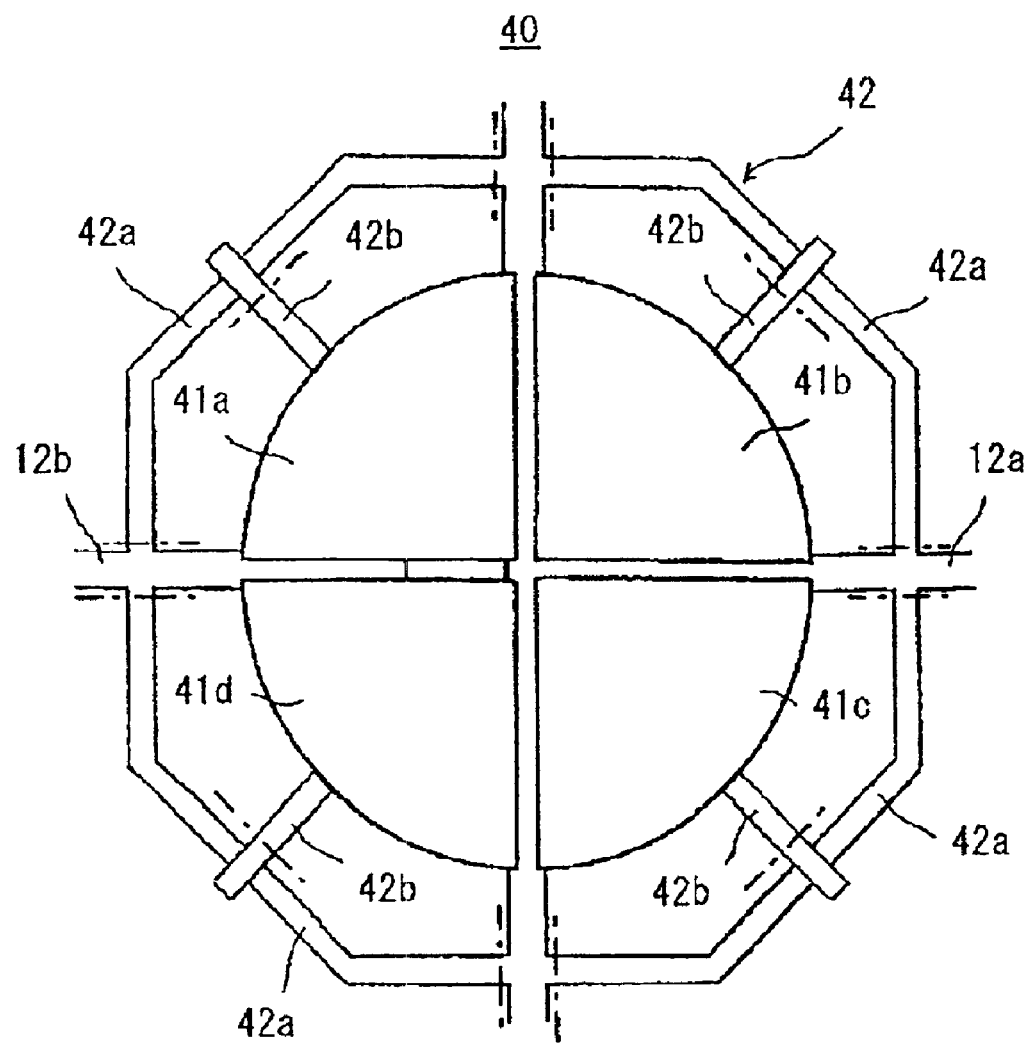
FIG. 18 is a schematic front view of the lead frame with four fan-shaped portions folded towards the center.

FIG. 17 is a schematic front view of a part of a lead frame to be used for the manufacture of a light-emitting diode 10d; and FIG. 18 a schematic front view of a part of the lead frame of which the fan-shaped portions are bent inward together. A lead frame 40 as shown in FIG. 17 is prepared from a metal plate by punching work. The lead frame 40 comprises lead assemblies 12a and 12b, fan-shaped portions (metal fragments) 41a, 41b, 41c and 41d corresponding with reflection mirror fragments 17a, 17b, 17c and 17d, and connecting portions 42 connecting the lead assemblies 12a and 12b with the fan-shaped portions 41a, 41b, 41c and 41d. The connecting portions 42 consists of an arch-shaped joint 42a connecting the lead assemblies 12a and 12b, and a linear joint 42b connecting the arch-shaped joint 42a with one of the fan-shaped portions 41a, 41b, 41c and 41d.

This embodiment allows the limbs of lead assembly 12a to extend vertically and leftward. This is because this arrangement makes it possible for the lead frame to firmly hold the fan-shaped portions 41a, 41b, 41c and 41d.

Next, at least one side of the lead frame 40 is plated with a metal. Here, let's assume that the surface of the lead frame 40 as appears in FIG. 17 is plated with a metal. Later, a light-emitting element 11 is mounted on a predetermined site of the lead assembly 12a. The light-emitting element 11 and the lead assembly 12b are connected with a wire 13 by bonding.

Then, the lead frame 40 is processed by stamping such that each of the fan-shaped portions 41a, 41b, 41c and 41d takes a concave shape. In this particular example, the fan-shaped portion has its face appearing in FIG. 17 processed to take a concave shape. Stamping should follow bonding as described above because it is desirable to perform mounting and wire-bonding on a flat lead frame. Then, each of the fan-shaped portions 41a, 41b, 41c and 41d is bent inward (upward in FIG. 17) along the point-dash line in the figure until it occupies a proper position with respect to the site at which the lead frame 40 resides to give a pattern as depicted in FIG. 18. The light-emitting element 11 and the bonding wire 13 are omitted from FIG. 18. Through this procedure, a reflection mirror 17 is formed opposite to the light-emitting element 11. As seen from above, this production method allows the reflection mirror 17 to be aligned with the lead assembly 12a carrying the light-emitting element 11 during stamping, and thus is improved in workability. Even if a plate material must be used which is so vulnerable that, when stamped at a time, will easily develop cracks, such plate material may be used as a material of a lead frame according to this method whereby it is possible to stamp the fan-shaped portions one after another until all the portions are stamped safely.

Later, as in the first embodiment, transfer molding is introduced whereby the light-emitting element 11, parts of lead assemblies 12a and 12b, the bonding wire 13 and the reflection mirror 17 are integrally sealed with a resin, to produce thereby a radiation surface 21. Then, the lines indicated by dot-dash lines in FIG. 18 are cut to produce a light-emitting diode 10d as shown in FIGS. 14, 15 and 16.

Since the concave reflection mirror incorporated in the light-emitting diode of the fifth embodiment has been obtained by stamping a metal plate as in the first embodiment, it is resistive to thermal changes, and will not develop any wrinkles on its surface or be free from any damages even in the presence of high temperatures. Because of this, packing such light-emitting diodes into a pattern and wiring them can be achieved by using a reflow furnace containing solder melt. Even the light-emitting diode incorporating a reflection mirror prepared from a metal plate by stamping will ensure production based on the use of conventional apparatuses, as long as the light-emitting element and parts of lead assemblies, and the reflection mirror are sealed during molding with a light transmissible material, so as to make one surface of the light transmissible material serve as a radiation surface. This will ensure mass production of the light-emitting diode.

Description has been given above about the fifth embodiment in which the light-emitting element, parts of lead assemblies and the reflection mirror are integrally sealed with the light transmissible resin. However, the sealing agent may be light transmissible glass having a low melting point.

Further, those elements are not always fixed by a sealing agent. For example, parts of the lead assemblies and the reflection mirror may be held by some mechanical fixing agents.

Figure 19:
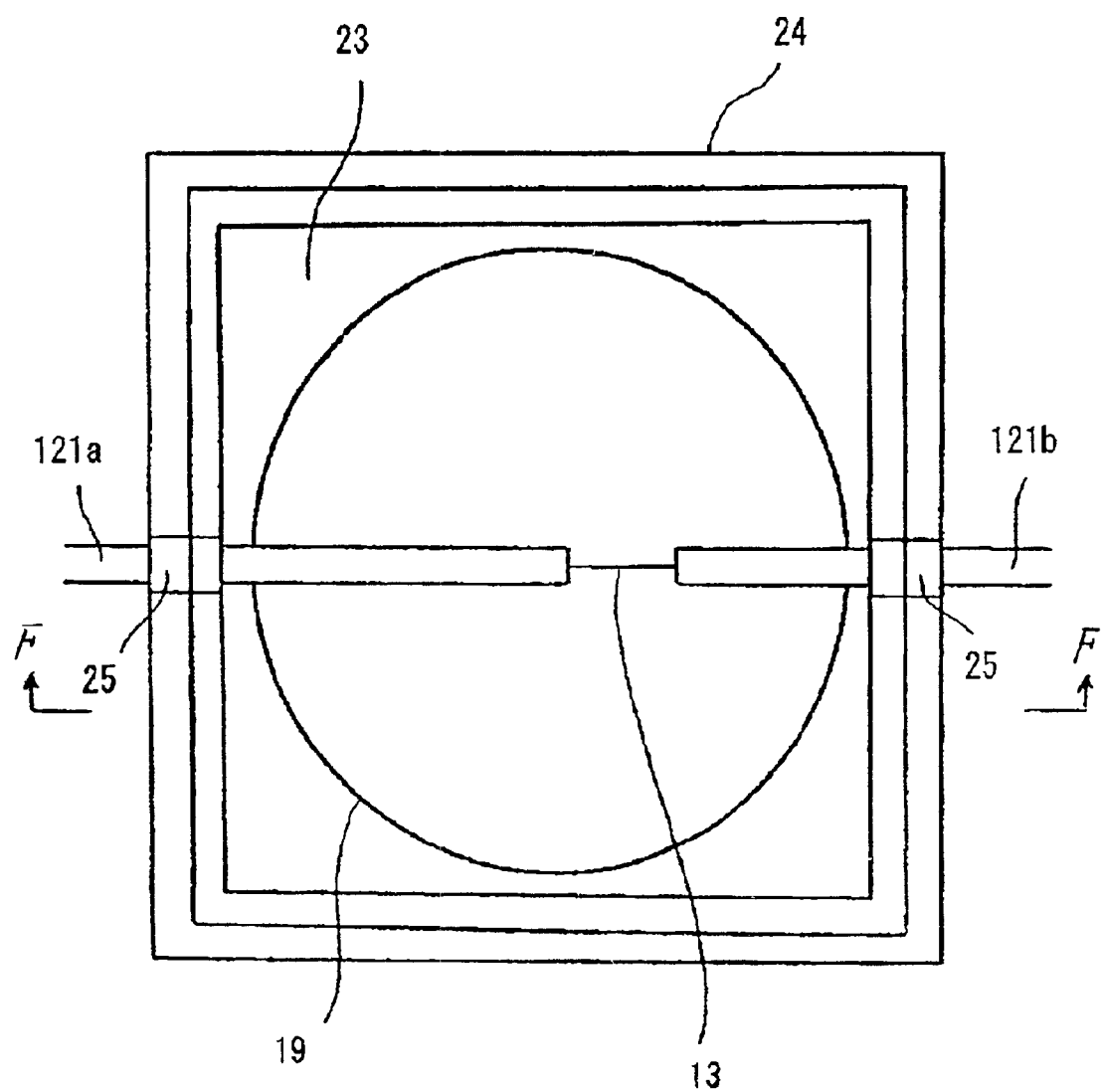
FIG. 19 is a schematic front view illustrating a light-emitting diode according to a sixth embodiment of the present invention.

Next, a sixth embodiment will be described with reference to the attached figures. FIG. 19 is a schematic front view of a light-emitting diode according to the sixth embodiment of this invention; and FIG. 20 a cross-sectional view of the same light-emitting diode taken along the line F—F. In the sixth embodiment, elements and parts having functions identical to those of the first embodiment are marked with the same reference numerals, and therefore need not be described in detail.

Figure 20:
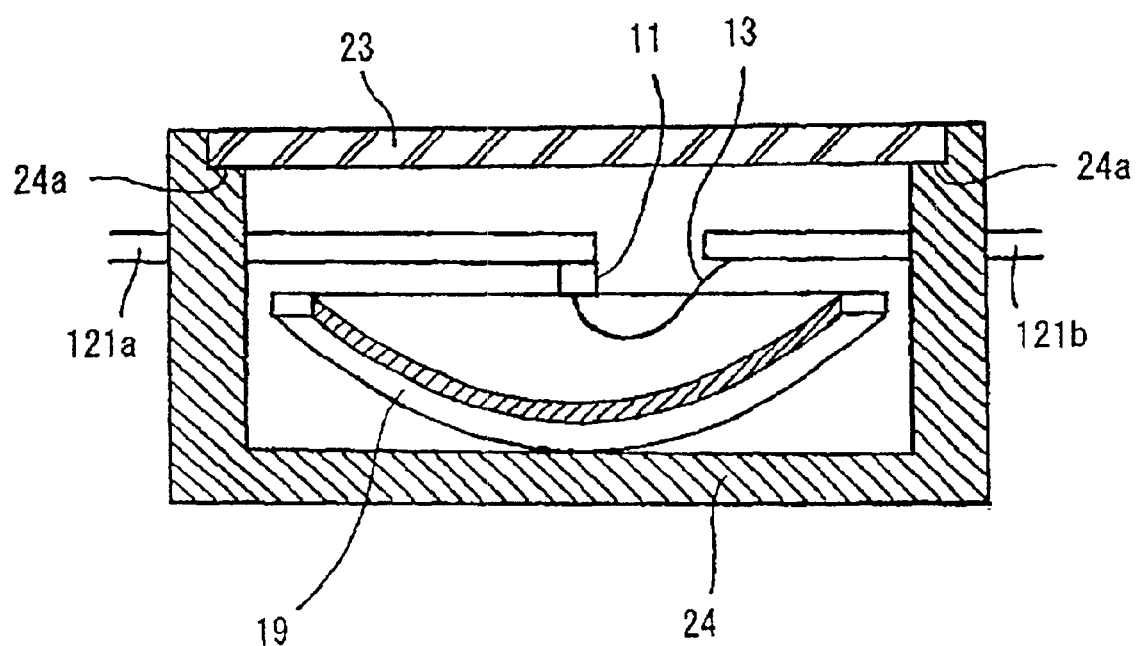
FIG. 20 is a schematic cross-sectional view of the light-emitting diode taken along the line D—D in FIG. 19.

As shown in FIGS. 19 and 20, a light-emitting diode 10e according to the sixth embodiment comprises a light-emitting element 11, lead assemblies 121a and 121b, a bonding wire 13, a concave reflection mirror 19, a planar radiation plate 23, and a metal case 24. The metal case 24, when viewed from above, takes a rectilinear shape, and contains the light-emitting element 11, parts of lead assemblies 121a and 121b, the bonding wire 13, the reflection mirror 19, and the radiation plate 23.

The lead assemblies 121a and 121b are adapted to supply electric power to the light-emitting element 11. The light-emitting element 11 is mounted on one end of the lead assembly 121a, and the light-emitting element 11 and the lead assembly 121b are electrically interconnected by the bonding wire 13. When viewed from front, the lead assembly 121a is drawn out from the left side of the case 24 while the lead assembly 121b from the right side of the case 24 as shown in FIG. 19.

The reflection mirror 19 has been obtained by processing a metal plate (such as copper or copper alloy plate) by stamping to give it a smooth, concave surface, and by treating the surface with plating or deposition of, for example, silver. The reflection mirror 19 is shaped like approximately a paraboloid of revolution having a focal point at which the center of the light-emitting element 11 is disposed. In the sixth embodiment, the reflection mirror 19 does not have any protrusions on its circumference, in contrast with the first embodiment.

The reflection mirror 19 is fixed on the bottom of the case 24. The case 24 has grooves on the upper parts of its side walls. The lead assemblies 121a and 121b are inserted through the grooves into the case 24. Thus, the light-emitting element 11, parts of lead assemblies 121a and 121b, and the bonding wire 13 are placed within the case 24.

A radiation plate 23 is to transmit light reflected on the reflection mirror 19 to irradiate it to the outside. The material to be used for the manufacture of the radiation plate 23 may include, for example, glass. The case 24 has steps 24a on the inner sides of the top ends of its side walls, and the radiation plate 23 fitly rests on the steps 24a.

The grooves of the case 24 are filled with a resin 25 after having passed the lead assemblies 121a and 121b, and the radiation plate 23 is fixed with an adhesive agent. Thus, the light-emitting diode 10e has an air-tight sealed structure. In the sixth embodiment, a metal case 24 is used. In this embodiment, direct contact of lead assemblies 121a and 121b with the case 24 is carefully avoided by, for example, inserting an insulating material between the lead assemblies 121a, 121b, and the case 24.

Next, processes for manufacturing a light-emitting diode 10e according to the fifth embodiment will be described. A light-emitting element 11 is mounted on a predetermined site of a lead assembly 121a. A light-emitting element 11 and a lead assembly 121b are connected with a wire 13 by bonding. Then, a reflection mirror 19 is placed in the case 24, and has its base fixed on the bottom of the case 24. Later, lead assemblies 121a, 121b are inserted through grooves of the case 24, and a radiation plate 23 is placed on the top of the case 24 to fit into the space defined by the steps 24a. During this procedure, care should be taken such that the cavity in the case 24 is filled with dry air. While keeping air in the cavity dry, an adhesive agent is applied to fix the radiation plate 23 onto the case 24, and the resin 25 is applied to fill the gaps present in the grooves of the case 24. Sealing the case 24 in an air-tight manner while keeping air of its cavity dry is to prevent the light-emitting element 11 to be sealed in the cavity from being degraded in the presence of moisture which would otherwise be entrapped in the cavity. This is also because of preventing the entry of dusts and debris in the cavity. Through the above procedures, a light-emitting diode 10e as shown in FIGS. 19 and 20 is obtained.

Since the concave reflection mirror incorporated in the light-emitting diode of the fifth embodiment has been obtained by stamping a metal plate as in the first embodiment, it is resistive to thermal changes, and will not develop any wrinkles on its surface or be free from any damages even in the presence of high temperatures. Because of this, packing such light-emitting diodes into a pattern and wiring them can be achieved by using a reflow furnace containing solder melt. The light-emitting diode will ensure easy production based on the use of conventional apparatuses, and thus mass production.

If the light-emitting diode includes a light-emitting element which emits rays whose wavelengths fall in the short visible to ultra-violet regions, and if it is obtained by having sealed the light-emitting element, parts of lead assemblies, and a reflection mirror with an epoxy resin serving as a light transmissible material, the epoxy resin will soon degrade in the presence of the rays emitted by the light-emitting element. This has been a problem. However, the light-emitting diode of the sixth embodiment, of which the light-emitting element is not sealed with a resin, is exempt from this problem. Moreover, air-tight sealing of the case will retard the degradation of the light-emitting element due to moisture.

Particularly, with this embodiment, it is possible to obtain a light-emitting diode capable of emitting white light by applying a fluorescent material on the inner surface of the radiation plate. To be concrete, if the light-emitting diode incorporates a light-emitting element capable of emitting ultra-violet rays, the rays impinge on the fluorescent material to cause it to emit white light. If the light-emitting diode incorporates a light-emitting element capable of emitting blue light, one part of the blue light passes through the fluorescent material and the other part is absorbed by the fluorescent material which in turn emits yellow light. The blue light and the yellow light overlap with each other to turn into white light which is radiated to the outside. The fraction of blue light to pass through the fluorescent material varies depending on the thickness of the fluorescent layer formed on the radiation surface. A main factor responsible for the degradation of a fluorescent material is moisture. The light-emitting diode of the sixth embodiment of which the case filled with dry air is kept air-tight will be able to retard the degradation of a fluorescent material even if such a material is incorporated as an element of the diode.

Let's assume that the light-emitting diode incorporates a light-emitting element capable of emitting ultra-violet rays.

Ultra-violet rays are not efficiently reflected by a silver surface. Therefore, the reflection mirror is preferably obtained by depositing aluminum on a concave surface, instead of plating silver on the surface. Application of a fluorescent material onto the radiation surface may occur by allowing the radiation plate to be immersed with the fluorescent material during fabrication of the plate, instead of by coating the material onto the plate.

Description has been given above about the sixth embodiment in which the case is filled with dry air and kept air-tight. However, the case may be filled with an inert gas, which will make it possible to prevent the reflection mirror from being oxidized.

Figure 21:
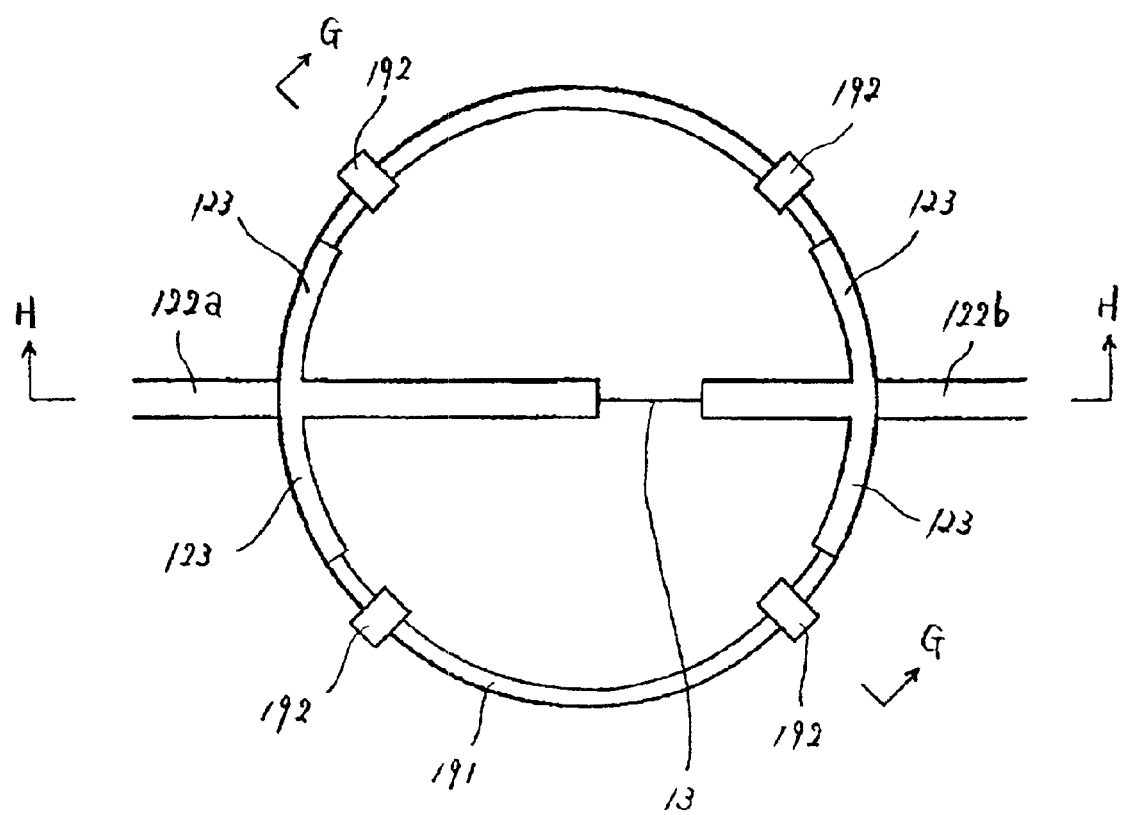
FIG. 21 is a schematic front view illustrating a light-emitting diode according to a seventh embodiment of the present invention.
Figure 22:
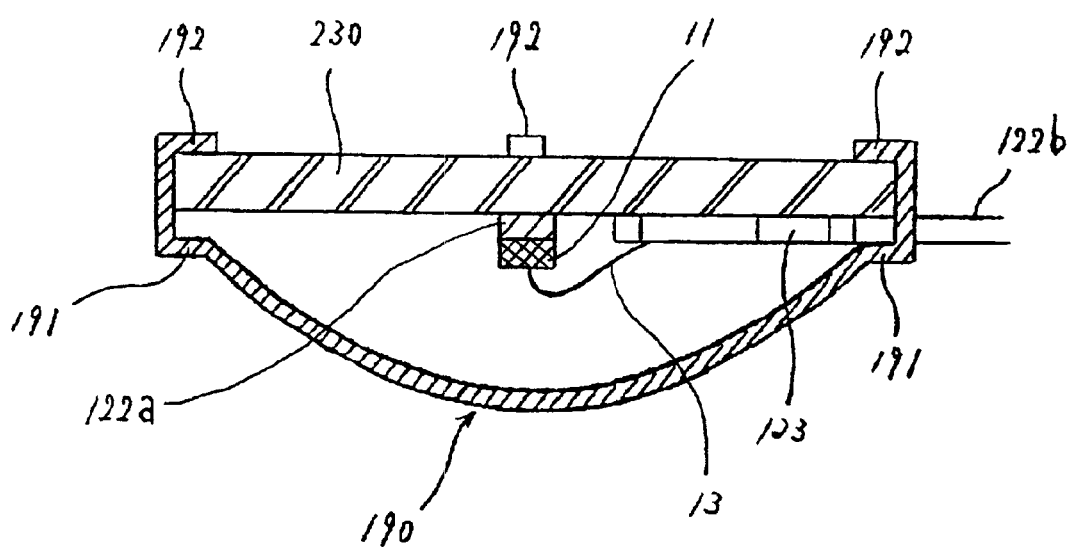
FIG. 22 is a schematic cross-sectional view of the light-emitting diode taken along the line G—G in FIG. 21.
Figure 23:
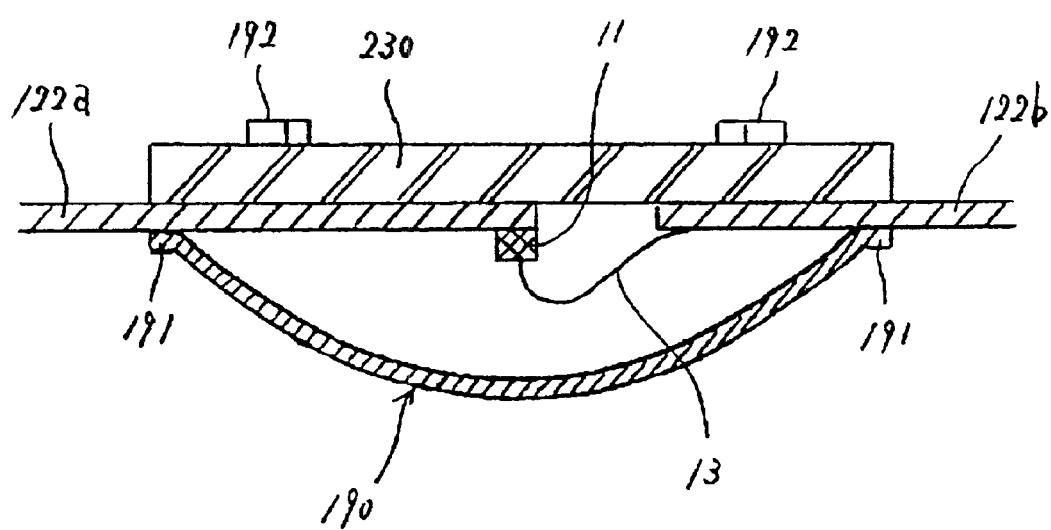
FIG. 23 is a schematic cross-sectional view of the light-emitting diode taken along the line H—H in FIG. 22.

Next, a seventh embodiment will be described with reference to the attached figures. FIG. 21 is a schematic front view of a light-emitting diode according to the seventh embodiment of this invention; FIG. 22 a cross-sectional view of the same light-emitting diode taken along the line G—G; FIG. 23 a cross-sectional view of the same light-emitting diode taken along the line H—H; and FIG. 24 a schematic rear view of the same light-emitting diode. In the seventh embodiment, elements and parts having functions identical to those of the first embodiment are marked with the same reference numerals, and therefore need not be described in detail.

As shown in FIGS. 21, 22 and 23, a light-emitting diode 10f according to the seventh embodiment comprises a light-emitting element 11, lead assemblies 122a and 122b, a bonding wire 13, a concave reflection mirror 190, and a radiation plate 230. The radiation plate 230 is to transmit light reflected on the reflection mirror 190 to irradiate it to the outside, and has a round shape, when viewed from above. The material to be used for the manufacture of the radiation plate 23 may include, for example, glass.

The lead assemblies 122a and 122b are adapted to supply electric power to the light-emitting element 11. The light-emitting element 11 is mounted on one end of the lead assembly 122a, and the light-emitting element 11 and the lead assembly 122b are electrically interconnected by the bonding wire 13. When viewed from front, the lead assembly 122a is drawn out from the left side of the diode while the lead assembly 121b from the right side of the diode as shown in FIG. 21.

Each of the lead assemblies 122a, 122b has arms 123 extending towards opposite sides. The arm 123 runs along the rim 191 of the reflection mirror 190 as shown in FIG. 21. This arrangement makes it possible for the lead assemblies 122a, 122b to be more firmly fixed between the reflection mirror 190 and the radiation plate 230 than would be the case lacking such arms, because then the lead assemblies 122a, 122b are fixed at wider areas. The lead assemblies 122a, 122b are placed in contact with the rim 191 of the reflection mirror 190.

The reflection mirror 190 is obtained by stamping a mirror-surface-treated aluminum plate to cause it to take a concave shape as in the first embodiment. A mirror-surface-treated aluminum plate is obtained by the same method as described above with respect to the second embodiment. The seventh embodiment uses an aluminum plate which has received alumite treatment on its surface. This treatment will not only retard the oxidation of the plate, but prevent the lead assemblies 122a, 122b from being shunted with the reflection mirror 190, even if the former is in direct contact with the latter. However, care must be taken to perform the alumite treatment at a level lower than the standard level, for fear that the linear reflectance of the reflection mirror 190 might be unduly reduced.

An alternative method consists of coining an aluminum plate, thereby causing it to take a mirror-surface-treated state, and by stamping it into a concave shape. In this case too, the aluminum plate should receive alumite treatment.

Figure 24:
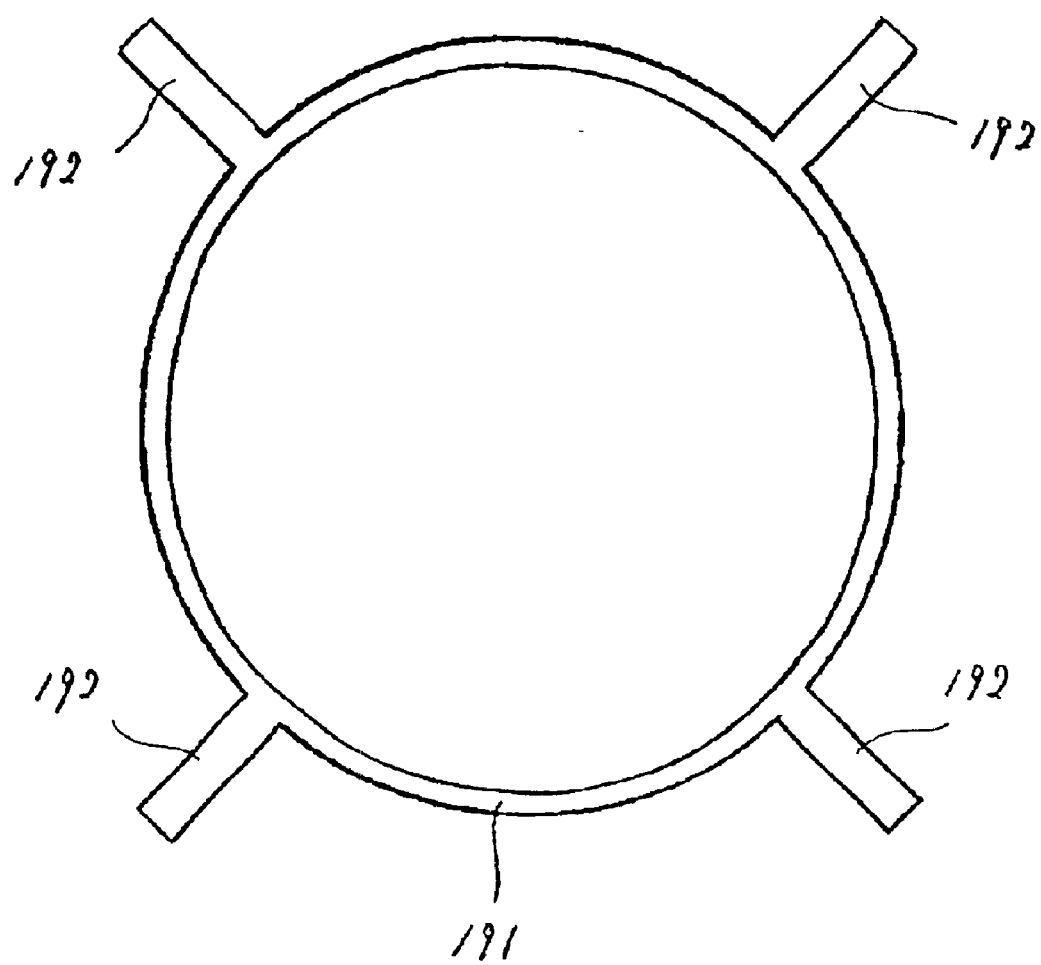
FIG. 24 is a schematic front view of a reflection mirror to be used for the light-emitting diode.

The reflection mirror 190 has at its circumference the rim 191 which extends in a plane perpendicular to the central axis of the reflection mirror. The rim 191 looks annular when viewed from above. The reflection mirror 190 has four claws 192 on its rim 191 as shown in FIGS. 21 and 24. These claws 192 are to hold the radiation plate 230 together with the lead assemblies 122a and 122b set in place above the reflection mirror 190, by firmly pressing the assembly from above. The reflection mirror 190 may be thought to serve also as a case to contain the light-emitting element 11, parts of the lead assemblies 122a, 122b, the bonding wire 13 and the radiation plate 230 within its cavity.

Next, processes for manufacturing a light-emitting diode 10f according to the seventh embodiment will be described. A light-emitting element 11 is mounted on a predetermined site of a lead assembly 122a. The light-emitting element 11 and a lead assembly 121b are connected with a wire 13 by bonding. Then, lead assemblies 122a, 122b, and a radiation plate 230 are placed over a reflection mirror 190 in this order. During this operation, lead assemblies 122a and 122b are placed over the reflection mirror 190 such that the arms 123 of the former rest on the rim 191 of the latter. Care must be taken not to bring the arm 123 into contact with the claws 192 of the reflection mirror 190.

Later, the claws 192 of the reflection mirror 190 are bent upward and then inward when viewed from front, to hold the upper surface of the radiation plate 123. Alumite may peel off when the claws 192 are bent. However, as long as care is taken to keep the arms 123 apart from the claws 192 as mentioned above, the lead assemblies 122a, 122b will be safely prevented from shunting with the reflection mirror 190, even if alumite is peeled off. Through the above procedures, a light-emitting diode 10f as shown in FIGS. 21, 22 and 23 is obtained.

The light-emitting diode of the seventh embodiment does not seal the light-emitting element with a resin. Therefore, even if it incorporates a light-emitting element capable of emitting ultra-violet rays, it will be exempt from a problem that a light-emitting diode which seals the same light-emitting element with a transparent resin might encounter, that is, accelerated degradation of the resin, as mentioned to the sixth embodiment. Generally, ultra-violet rays activate a metal, thereby causing it to degenerate. The light-emitting diode of the seventh embodiment incorporates the reflection mirror which, having received alumite treatment on its surface, is capable of retarding the degradation of the mirror even in the presence of ultra-violet rays. In view of this, the light-emitting diode of the seventh embodiment may particularly suitably incorporate a light-emitting element capable of emitting the rays of short visible to ultra-violet regions. Other advantages are the same with those of the first embodiment Addition of the rim to the reflection mirror will facilitate the fabrication of the reflection mirror because the mirror will be stabilized by virtue of the rim. Use of a metal plate as a material of the reflection mirror and contacting the lead assemblies with the rim of the reflection mirror will allow heat generated by the light-emitting element to be transmitted to the reflection mirror via the lead assemblies, which improves heat radiation property. If one of the lead assemblies that carries the light-emitting element is placed in contact with or close to the reflection mirror, it will be possible to further enhance heat radiation property.

Figure 25:
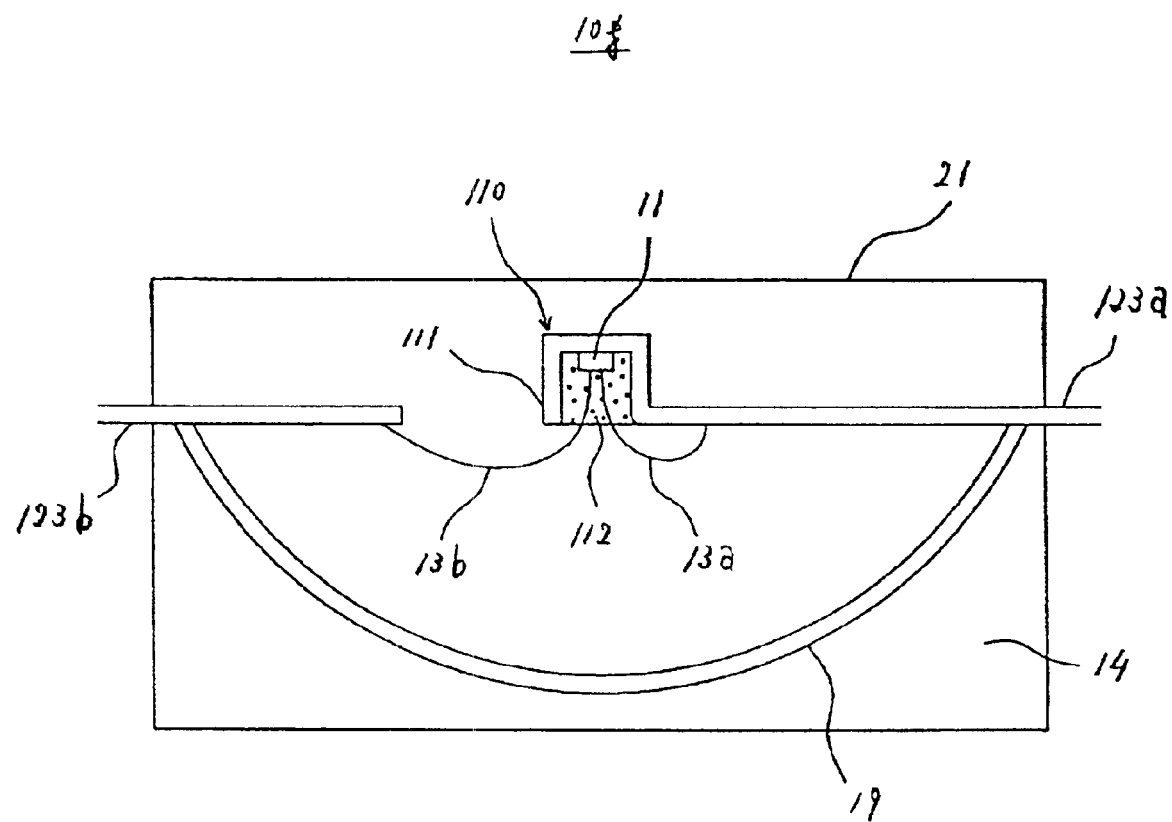
FIG. 25 is a schematic cross-sectional view illustrating a light-emitting diode according to an eighth embodiment of the present invention.

Next, an eighth embodiment will be described with reference to the attached figures. FIG. 25 is a schematic front view of a light-emitting diode according to the eighth embodiment of this invention. In the eighth embodiment, elements and parts having functions identical to those of the first embodiment are marked with the same reference numerals, and therefore need not be described in detail.

As shown in FIG. 25, a light-emitting diode 10g according to the eighth embodiment comprises a light-emitting element 11, lead assemblies 123a and 123b, bonding wires 13a and 13b, a light transmissible material 14, a concave reflection mirror 19, and a radiation surface 21. The reflection mirror 19 is the same with that of the sixth embodiment. The reflection mirror 19 has been obtained by processing a metal plate by stamping to give it a smooth, concave surface, and by applying silver and such on its surface via plating or vapor deposition.

The lead assemblies 123a and 123b are adapted to supply electric power to the light-emitting element 11. The lead assembly 123a has on its tip end a mount 110 to receive the light-emitting element 11. The mount 110 includes a recess 111 and a light transmissible material 112 having a fluorescent material dispersed therein. The recess 111 opens its mouth towards the reflection mirror 19, the center of the mouth being in alignment with the central axis of the reflection mirror 19. The recess 111 is obtained by processing an electro-conductive metal such as an iron alloy or a copper alloy by stamping or punching work so as to be integrally united with the lead assembly 123a. The inside walls of the recess 111 (side walls and base) have their surfaces treated to serve as a mirror, so as to enhance the reflection efficiency. Generally, the recess may take any form: it may be cup-like, cylindrical, semispherical, pyramidal, etc.

The light-emitting element 11 is placed at the center of the base of the recess 111. The light-emitting element 11 is electrically connected with the lead assembly 123a via the bonding wire 13a, and is electrically connected with the lead assembly 123b via the bonding wire 13b. Moreover, the light-emitting element 11, and parts of the bonding wires 13a, 13b are sealed with the light transmissible material 112. Sealing may be performed, for example, by potting whereby a light transmissible material 112 is allowed to fall dropwise in the recess 111 to harden there. On the other hand, the mount 110, parts of lead assemblies 123a, 123b, parts of bonding wires 13a, 13b, and the reflection mirror 19 are integrally sealed with another light transmissible material 14.

The light transmissible material 112 may be the same with or different from the light transmissible material 14. The light transmissible material 112 has a fluorescent material dispersed uniformly in it. Of course, the dispersion of the fluorescent material in the light transmissible material 112 may be modified as needed: it may have a certain gradient, or be deviated to a desired side. The fluorescent material serves as an agent to change the wavelengths of the rays emitted by the light-emitting element 11. This arrangement makes it possible to obtain, in addition to light emitted by the light-emitting element 11, light generated by the fluorescent material in response to light emitted by the light-emitting element 11, from the mouth of the recess 111 filled with the light transmissible material 112.

With the light-emitting diode 10g of the eighth embodiment, the light transmissible material 112 containing a fluorescent material fills the recess 111 of the mount 110, and thus a part of light emitted by the light-emitting element 11 is absorbed or scattered by the fluorescent material. Light emanating from the fluorescent material never fails to pass through the mouth of the recess 111 to go out of the recess 111. The mouth faces the reflection mirror 19 such that its center is in alignment with the central axis of the latter. Thus, all rays radiated to the outside from the recess 111 including those that travel in directions normal to the central axis of the reflection mirror are captured by the reflection mirror 19, to be turned there into rays traveling in parallel with the central axis. This arrangement makes it possible not only to effectively radiate to the outside all rays emitted by the light-emitting element 11 (including rays reflected or modified the wavelengths by the fluorescent material, as well as straight rays), but to control the direction of radiation. The light-emitting diode of the eight embodiment having the configuration as described above ensures the same advantages as does the first embodiment.

Figure 26:
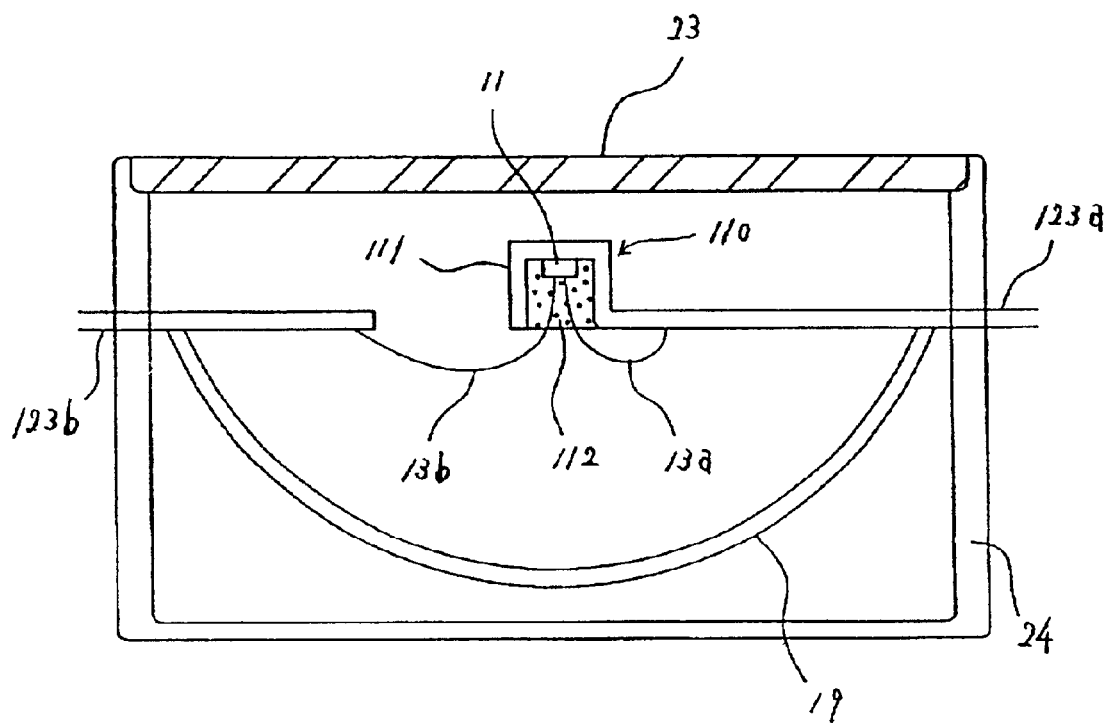
FIG. 26 is a schematic cross-sectional view illustrating a variation of the light-emitting diode representing the eight embodiment.
Figure 27:
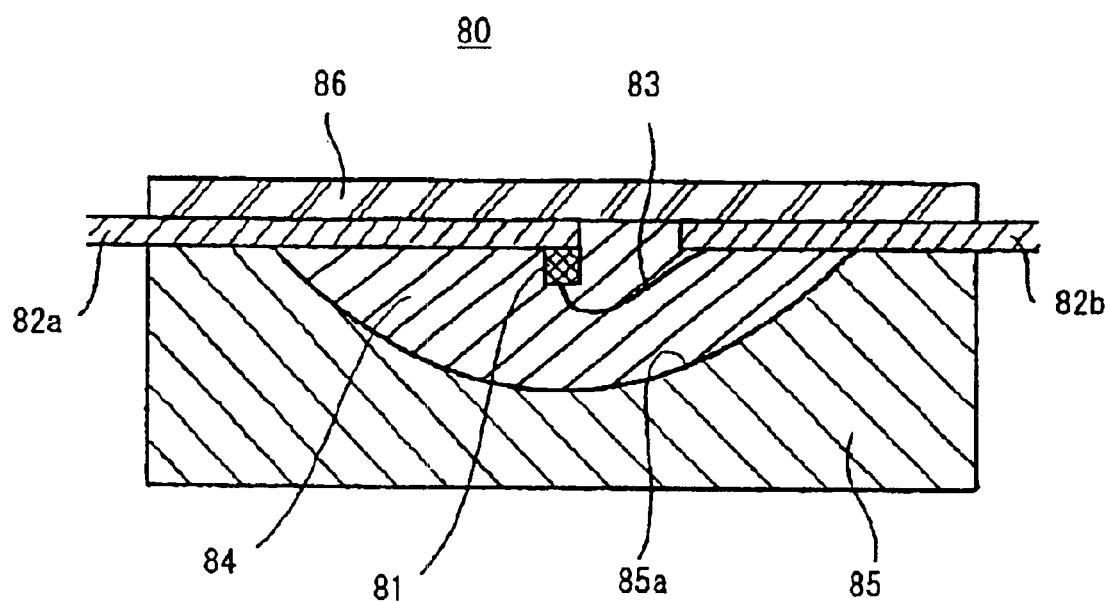
FIG. 27 is a schematic cross-sectional view illustrating a light-emitting diode according to a first embodiment of the prior art.
Figure 28:
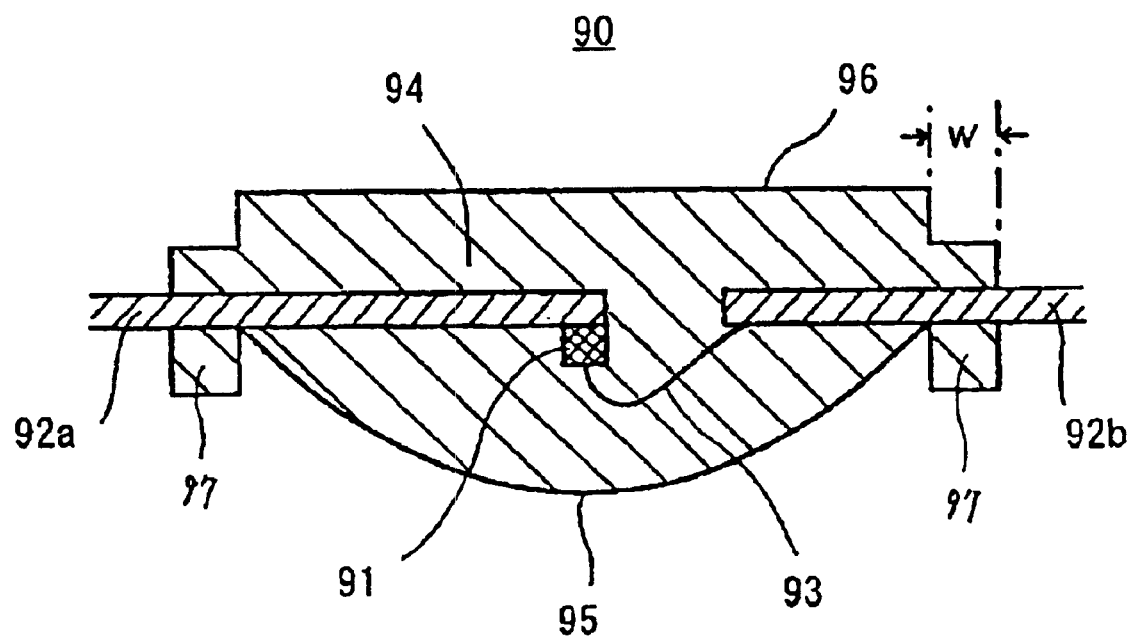
FIG. 28 is a schematic cross-sectional view illustrating a light-emitting diode according to a second embodiment of the prior art.

Description has been given above about the eighth embodiment wherein the mount, parts of lead assemblies, parts of the bonding wires, and the reflection mirror are sealed with the light transmissible material. However, the mount and such may be fixed in a case as in the sixth embodiment, instead of being sealed with a light transmissible material. An example of such a light-emitting diode produced as described above is shown in FIG. 26. FIG. 26 is a schematic cross-sectional view of a variant light-emitting diode of the eighth embodiment. The light-emitting diode shown in FIG. 26 comprises a light-emitting element 11, a mount 110, lead assemblies 123a, 123b, bonding wires 13a, 13b, a concave reflection mirror 19, a planar radiation plate 23, and a metal case 24. The light-emitting diode configured as above ensures, in addition to the advantages ascribed to the eighth embodiment, an advantage of dispensing with the use of a resin for fixing the mount and such, and the resin, if used, would degrade and turn yellow in the presence of light from the light-emitting element, particularly when the light has short wavelengths corresponding to ultra-violet regions.

The present invention is not limited to any of the embodiments described above, and can be modified in various manners within its scope.

To mention an example just for illustration, in the above embodiments, the metal plate to serve as a material of the reflection mirror is made of copper alloy or aluminum. Generally, however, the metal plate to serve as a material of the reflection mirror may be made of any alloys mainly composed of copper, iron, aluminum, etc. Or, any other metals may be used for the same purpose, as long as their amenity to processing and reflectance are sufficiently good to satisfy the requirements of a common light-emitting diode.

What is claimed is:

1. A light-emitting diode comprising:
   a light-emitting element;
   a lead assembly for supplying electrical power to said light-emitting element;
   a metal plate, pre-formed into a concave shape, that forms a reflection mirror, said reflection mirror provided in an opposing relation to the light-emitting surface of said light-emitting element, said light-emitting element mounted a predetermined distance from a reflective surface of said reflection mirror, said concave-shaped metal plate having a design feature so that it is held in place as a stand-alone reflection mirror element in a molding die during a fabrication of said light-emitting diode;

a light-transmissible material for sealing said light-emitting element, a part of the lead assembly and the reflection mirror; and a radiation surface for radiating light reflected on said reflection mirror to the outside, wherein said reflection mirror comprises a metal mirror which is obtained by processing said metal plate to give it said concave shape or which is obtained by mirror-surface-treating the concave surface of said metal mirror formed by said processing of said metal plate, said radiation surface is formed on the light-transmissible material at its surface at the rear of the light-emitting element, and a through-hole is formed through said reflection mirror to serve as an air escape path during an assembly of said light-emitting diode.

2. A light-emitting diode as described in claim 1, wherein the distance from the edge of said reflective mirror to the edge of a sealing mass comprising said light-transmissible material is less than 1.0 mm.

3. A light-emitting diode as described in claim 1, wherein the light-transmissible material is essentially shaped like a square when viewed from the side of the radiation surface, and the lead assembly is led to the outside from the base of the light-transmissible material close to a corner of the square.

4. A light-emitting diode comprising:

a light-emitting element;

a lead assembly for supplying electrical power to said light-emitting element;

a metal plate, pre-formed into a concave shape, that forms a reflection mirror, said reflection mirror provided in an opposing relation to the light-emitting surface of said light-emitting element, said light-emitting element being mounted a predetermined distance from a reflective surface of said reflection mirror, said concave-shaped metal plate having a design feature so that it is held in place as a stand-alone reflection mirror element in a molding die during a fabrication of said light-emitting diode; and a radiation surface for radiating light reflected on said reflection mirror to the outside, wherein said reflection mirror comprises a metal mirror which is obtained by combining a plurality of metal plate portions to give the assembly a concave shape or which is obtained by mirror-surface-treating the concave surface of said metal mirror.

5. A light-emitting diode as described in claim 4, wherein said light-emitting element, part of said lead assembly and said reflection mirror are sealed with a light-transmissible material, and said radiation surface is formed on the light-transmissible material at its surface at the rear of the light-emitting element.

6. A light-emitting diode comprising:

a light-emitting element;

a lead assembly for supplying electrical power to said light-emitting element;

a metal plate, preformed into a concave shape, that forms a reflection mirror, said reflection mirror provided in an opposing relation to the light-emitting surface of said light-emitting element, said light-emitting element being mounted a predetermined distance from a reflective surface of said reflection mirror, said concave-shaped metal plate having a design feature so that it is held in place as a stand-alone reflection mirror element in a molding die during a fabrication of said light-emitting diode;

a radiation plate for radiating light reflected on said reflection mirror to the outside; and a case for containing said light-emitting element, a part of said lead assembly, and said reflection mirror, wherein said reflection mirror comprises a metal mirror which is obtained by processing said metal plate to give it said concave shape or which is obtained by mirror-surface-treating the concave surface of said metal mirror formed by said processing of said metal plate, and said radiation surface is formed on a a surface of a light-transmissible material that seals said light-emitting element, a portion of said lead assembly, and at least a portion of said metal mirror.

7. A light-emitting diode comprising:

a light-emitting element;

a lead assembly for supplying electrical power to said light-emitting element;

a reflection mirror provided in an opposing relation to the light-emitting surface of said light-emitting element;

a light-transmissible material for sealing said light-emitting element, a part of the lead assembly and the reflection mirror; and a radiation surface for radiating light reflected on said reflection mirror to the outside, wherein said reflection mirror comprises a mirror which is obtained by processing ceramic to give it a concave shape, and said radiation surface is formed on the light-transmissible material at its surface at the rear of the light-emitting element, said concave-shaped ceramic having a design feature so that it is held in place as a stand-alone reflection mirror element in a molding die during a fabrication of said light-emitting diode.

8. A light-emitting diode comprising:

a light-emitting element; and a concave reflection mirror provided in an opposing relation to the light-emitting surface of said light-emitting element, light emitted by said light-emitting element being reflected on said reflection mirror, to be radiated to the outside, wherein said reflection mirror comprises a mirror which is obtained by processing a metal plate to give it a concave shape, and said reflection mirror has a linear reflectance of 65% or higher, said concave-shaped reflection mirror having a design feature so that it is held in place as a stand-alone reflection mirror element in a molding die during a fabrication of said light-emitting diode.

9. A light-emitting diode as described in claim 8, wherein said reflection mirror comprises a metal mirror which is obtained by coining a metal plate to give it a mirror-surface, and then processing it to give it a concave shape.

10. A light-emitting diode as described in claim 8, wherein said metal mirror has received a mirror-surface-treatment on its concave surface.

11. A light-emitting diode as described in claim 8, wherein said reflection mirror is obtained by providing a metal plate which is obtained by removing portions surrounding a part to be made into the reflection mirror, thereby preparing open spaces around that part, coining the part to expand it without being exposed to any risk of distortions which might result if it had not been for the spaces, and processing the expanded part to turn it into a concave metal mirror, or is obtained by mirror-surface-treating the concave surface of said metal mirror.

12. A light-emitting diode as described in claim 11, wherein a lead assembly with said light-emitting diode mounted thereupon is disposed in contact with or close to said reflection mirror.

13. A light-emitting diode as described in claim 8, further comprising:
a lead assembly for supplying electric power to said light-emitting element;
a light-transmissible material for sealing said light emitting element, a part of said lead assembly and said reflection mirror; and
a radiation surface for radiating light reflected on said reflection mirror to the outside,
wherein said radiation surface is formed on the light-transmissible material at its surface at the rear of the light-emitting element.

14. A light-emitting diode as described in claim 8, wherein said reflection mirror is obtained by preparing a mirror-surface-treated planar plate, and then processing it to give it a concave shape.

15. A light-emitting diode as described in claim 8, wherein the metal plate serving as a material of said reflection mirror comprises one of copper, iron, and alloys mainly composed of those metals.

16. A light-emitting diode as described in claim 8, wherein the metal plate serving as a material of said reflection mirror comprises one of aluminum and alloys mainly composed of aluminum.

17. A light-emitting diode as described in claim 8, wherein the metal plate serving as a material of said reflection mirror comprises aluminum or alloys mainly composed of aluminum, and said reflection mirror receives alumite treatment on its concave mirror surface.

18. A light-emitting diode as described in claim 8, wherein said light emitting element emits light whose wavelength falls in the ultra-violet region.

19. A light-emitting diode as described in claim 8, wherein said reflection mirror includes around its circumference a rim whose outer surface extends in a direction in parallel with a plane essentially perpendicular to the central axis of said reflection mirror.

20. A light-emitting diode comprising:
a light-emitting element;
a lead assembly having a mount for mounting said light-emitting element; and
a metal reflection mirror provided in an opposing relation to the light-emitting surface of said light-emitting element, light emitted by said light-emitting element being reflected on said reflection mirror, to be radiated to the outside, said metal reflection mirror having a design feature so that it is held in place as a stand-alone reflection mirror element in a molding die during a fabrication of said light-emitting diode
wherein said mount has a recess whose mouth opens towards said reflection mirror with the center of the mouth being in alignment with the central axis of the reflection mirror, and the recess contains said light-emitting element, and a fluorescent material which converts the light emitted by said light-emitting element to light of a different wavelength.

21. A light-emitting diode comprising:
a light-emitting element;
a lead assembly for supplying electric power to said light-emitting element;
a metal plate, pre-formed into a concave shape, that forms a reflection mirror provided in an opposing relation to the light-emitting surface of said light-emitting element, said light-emitting element being mounted a predetermined distance from a reflective surface of said reflection mirror, said pre-formed metal plate having a design feature to be self-supported as a stand-alone reflection mirror element in a molding die during a fabrication process of said light-emitting diode;
a light-transmissible material for sealing said light-emitting element, a part of the lead assembly and the reflection mirror; and
a radiation surface for radiating light reflected on said reflection mirror to the outside.

22. A method of fabricating a light-emitting diode, said method comprising:
placing a concave-shaped material as a stand-alone reflection mirror into a molding die, said concave-shaped material having a design feature allowing it to be held firmly in said molding die;
placing a lead assembly a predetermined distance away from said reflection mirror, said lead assembly including a light-emitting diode element mounted on a first lead, said light-emitting diode element electrically connected to a second lead, said lead assembly placed so that said light-emitting diode element is located substantially at a focal point of said concave shape; and
injecting a resin into said molding die.

23. The method of claim 22, wherein said material comprises one of ceramic and a metal plate.

24. The method of claim 22, wherein said reflection mirror has at least one opening so that bubbles are released during said injecting of resin.

* * * * *